(12) United States Patent
Korenari et al.

(10) Patent No.: US 8,416,169 B2
(45) Date of Patent: Apr. 9, 2013

(54) DRIVE CIRCUIT, ACTIVE MATRIX SUBSTRATE, AND LIQUID CRYSTAL DISPLAY DEVICE

(75) Inventors: Takahiro Korenari, Kanagawa (JP); Kunihiro Shiota, Kanagawa (JP); Soichi Saito, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 889 days.

(21) Appl. No.: 12/470,056

(22) Filed: May 21, 2009

(65) Prior Publication Data

US 2009/0295699 A1 Dec. 3, 2009

(30) Foreign Application Priority Data

May 28, 2008 (JP) ................. 2008-140166

(51) Int. Cl.
*G09G 3/36* (2006.01)
(52) U.S. Cl.
USPC .............. 345/92; 345/204; 257/77; 349/151
(58) Field of Classification Search .............. 345/92, 345/204; 257/59, 72, 77, 79, 900
See application file for complete search history.

(56) References Cited

U.S. PATENT DOCUMENTS

| | | | | |
|---|---|---|---|---|
| 2002/0088990 A1* | 7/2002 | Iwamoto et al. | ............... | 257/136 |
| 2005/0029682 A1* | 2/2005 | Koh | ............... | 257/900 |
| 2006/0267116 A1* | 11/2006 | Shimamoto et al. | ........... | 257/411 |
| 2007/0045663 A1* | 3/2007 | Bito | ............... | 257/194 |
| 2007/0052653 A1* | 3/2007 | Shin | ............... | 345/98 |
| 2007/0257256 A1 | 11/2007 | Kugler | | |
| 2007/0278498 A1* | 12/2007 | Nakamura et al. | ............... | 257/79 |
| 2008/0044968 A1* | 2/2008 | Murthy et al. | ................. | 438/229 |
| 2008/0079009 A1* | 4/2008 | Yaegashi | ........................ | 257/77 |
| 2008/0079701 A1* | 4/2008 | Shin et al. | ..................... | 345/204 |
| 2008/0093602 A1 | 4/2008 | Matsumura et al. | | |
| 2008/0149931 A1* | 6/2008 | Koyama | ......................... | 257/59 |
| 2008/0253170 A1* | 10/2008 | Inaba | ........................... | 365/154 |

FOREIGN PATENT DOCUMENTS

| | | |
|---|---|---|
| CN | 1567073 | 1/2005 |
| CN | 101068040 | 11/2007 |
| CN | 101165907 | 4/2008 |
| JP | 07-045834 | 2/1995 |
| JP | 07-335891 | 12/1995 |
| JP | 09-018011 | 1/1997 |
| JP | 2003-115498 | 4/2003 |
| JP | 2005-223347 | 8/2005 |
| JP | 2006-338003 | 12/2006 |
| JP | 2006-351165 | 12/2006 |
| WO | WO 94/00882 | 1/1994 |

OTHER PUBLICATIONS

CN Office Action dated Jul. 17, 2012, with English translation; Application No. 200910202851.3.
Japanese Official Action dated Nov. 27, 2012 in corresponding Japanese Application No. 2008-140166 with English translation of Japanese Official Action.

* cited by examiner

*Primary Examiner* — Amare Mengistu
*Assistant Examiner* — Premal Patel
(74) *Attorney, Agent, or Firm* — Young & Thompson

(57) ABSTRACT

Off-leak current of a TFT, required for a drive circuit configured with a TFT of a single conductivity type, is realized with simple manufacturing steps. The impurity concentration of a source region and a drain region of a TFT is set between $2*10^{18}$ cm$^{-3}$ and $2*10^{19}$ cm$^{-3}$, whereby off-leak current of the TFT can be sufficiently reduced even in a single gate structure.

13 Claims, 17 Drawing Sheets

DRIVE CIRCUIT, ACTIVE MATRIX SUBSTRATE, AND LIQUID CRYSTAL DISPLAY DEVICE

CROSS-REFERENCE TO RELATED APPLICATION

This application is based upon and claims the benefit of priority from Japanese patent application No. 2008-140166, filed on May 28, 2008, the disclosure of which is incorporated herein in its entirety by reference.

BACKGROUND OF THE INVENTION

1. Field of the Invention

The present invention relates to a drive circuit configured with a thin-film transistor, an active matrix substrate and a liquid crystal display device using the same, and a method of reducing off-leak current of a thin film transistor. Hereinafter, a thin film transistor is referred to as a TFT.

2. Related Art

In an active matrix display device, a TFT is formed on a transparent substrate such as glass or quartz, and the TFT is used as a switch of a pixel. A TFT used as a switch of a pixel has to hold the voltage until the next writing when being turned off after a predetermined voltage has been written to a pixel electrode. However, if off-leak current of the TFT is larger, the written voltage is lowered via the TFT, causing a drop in contrast and the like.

Recently, a technique of forming not only pixel transistors but also some drive circuits on a glass substrate has been developed. In this technique, an n-channel type or p-channel type TFT is adopted as a pixel transistor, and a CMOS (Complementary Metal Oxide Semiconductor) circuit is often used as a drive circuit. Although a pixel transistor is required to have low off-leak current characteristics in order to hold the voltage as described above, a CMOS circuit configuring a drive circuit is not generally required to have low off-leak current characteristics as a pixel transistor.

In the case of using a CMOS circuit as a drive circuit, in order to reduce off-leak current of a pixel transistor, a technique of reducing impurity included in a source region or a drain region has been known (see Japanese Patent Laid-Open Publications No. 2005-223347 and No. 2003-115498, for example). When forming a pixel transistor and a CMOS drive circuit on the same substrate, a number of processes are required because n-channel type and p-channel type TFTs are formed. As such, in order to reduce the processes, a technique of forming a drive circuit using a TFT of the same conductivity type as that of a pixel transistor has been developed (see Japanese Patent Laid-Open Publication No. 2006-351165, for example).

In order to realize a drive circuit only with a TFT of a single conductivity type, a technique called bootstrap is often used. In this technique, it has been known that when off-leak current of a drive circuit is large, an intended drive voltage cannot be output, as described later. As such, in a drive circuit only including a single conductivity type TFT, the off-leak current thereof is required to be sufficiently reduced. For example, in the case of forming a drive circuit with a CMOS, when off-leak current of the TFT is $1*10^{-6}$ A or lower, erroneous operation can be generally prevented. Meanwhile, in the bootstrap technique for realizing a drive circuit only with a single conductivity type TFT, an intended normal voltage cannot be output unless the off-leak current of the TFT is $1*10^{-8}$ A or lower. Otherwise, a risk causing erroneous operation increases. As such, in the case of forming all pixel transistors and drive circuits with TFTs of a single conductivity type, it is indispensable to reduce off-leak current of not only the TFT of the pixel transistor but also the TFT of the drive circuit.

A TFT of a single drain structure has involved a problem of off-leak current being large. Off-leak current is caused by a tunneling phenomenon which occurs from the valence band to the conduction band of silicon because the drain end electric field becomes particularly large when the transistor is in an off state. Further, as a tunneling phenomenon through the in-gap level, which is unique to polycrystalline silicon, induces this problem, there is a problem that off-leak current is particularly large in a polysilicon TFT formed on a glass substrate. In order to address this problem, off-leak current is generally reduced by suppressing the electric field at the drain end by providing an LDD (Lightly Doped Drain) region at the end of the drain region, that is, between a channel region and the drain region.

However, a manufacturing method for realizing an LDD structure includes the steps of: forming a base film on a glass substrate, depositing a silicon film thereon; polycrystallizing the silicon film by heat treatment such as laser anneal, depositing a gate insulating film thereon, doping impurity for forming a source region and a drain region using a photoresist as a mask, forming a gate electrode, forming an LDD region by doping low-concentration impurity having the same polarity as that of the source region and the drain region using the gate electrode as a mask, forming an inter-layer insulating film, applying heat treatment for activating the impurity in the source region, the drain region, and the LDD region, exposing them in hydrogenated plasma so as to hydrogenate them; and forming a contact hall in the inter-layer insulating film and the gate insulating film above the source region, the drain region and the gate electrode and connecting a wire metal. As such, in order to realize an LDD structure, it is necessary to perform activation at least after forming the gate line, and the temperature of activation has to be lower than the melting point of the gate material.

As another technique for reducing off-leak current, there has been known a technique in which gates are simply aligned in series as a structure of double gates or triple gates, and impurity is doped between respective gates. This structure is equivalent to one in which a plurality of transistors are aligned in series, directed to distribute a drain voltage applied to one transistor into a plurality of transistors so as to reduce off-leak current. In this technique, however, although distribution of a drain voltage works so that a voltage resistance property can be improved in an on state, as a greater voltage is distributed to a transistor on the drain side in an off state, it is not significantly effective in reducing leak current.

As described above, as off-leak current is large in a single drain structure, an LDD structure is often adopted in order to suppress off-leak current. In that case, the following two problems are involved. One problem is that the number of steps simply increases because an LDD step is included.

A second problem is that as an LDD structure is formed after formation of a gate by doping impurity using a gate electrode as a mask, heat treatment for activation and hydrogenation are required after the formation of the gate electrode. Consequently, by performing activation (heat treatment) and hydrogenation after the formation of the gate, reformation becomes insufficient in the portion under the gate, i.e., the channel region. This is because non-uniform stress caused by heat stress and the like is applied to the portion under the gate, and diffusion of hydrogen radical is blocked by the gate electrode.

On the other hand, in a single drain structure which does not include an LDD structure, as it is only necessary to perform activation (heat treatment) of a source region and a drain region, activation and hydrogenation can be performed before formation of a gate electrode.

Further, in the structure of forming a drive circuit only with a TFT of the same conductivity type as that of a pixel transistor in order to reduce the manufacturing costs by reducing the steps, it is necessary to reduce off-leak current with respect to both TFTs for the pixel transistor and the drive circuit, and preferably, to all TFTs if possible. In a CMOS drive circuit, it is sufficient to reduce off-leak current regarding at least a pixel transistor.

SUMMARY OF THE INVENTION

An exemplary object of the present invention is to provide a drive circuit capable of realizing off-leak current of a TFT required for a drive circuit configured with a TFT of a single conductivity type with simple manufacturing steps.

A drive circuit according to an exemplary aspect of the invention is a drive circuit including a thin film transistor of a single conductivity type, in which the impurity concentration of the source region and the drain region of the thin film transistor is between $2*10^{18}$ cm$^{-3}$ and $2*10^{19}$ cm$^{-3}$.

DESCRIPTION OF EXEMPLARY EMBODIMENTS

Hereinafter, exemplary embodiments of the invention will be described in detail based on the drawings.

(First Exemplary Embodiment)

Figure 1:
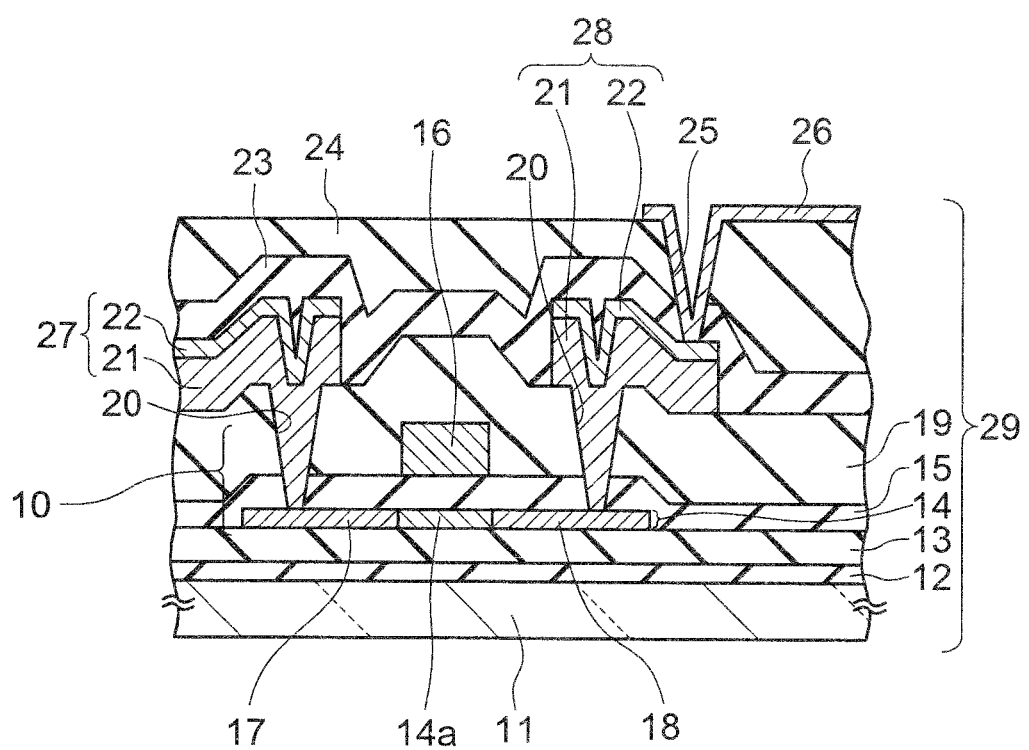
FIG. 1 is a cross-sectional view showing a TFT of a drive circuit according to a first exemplary embodiment.
Figure 2:
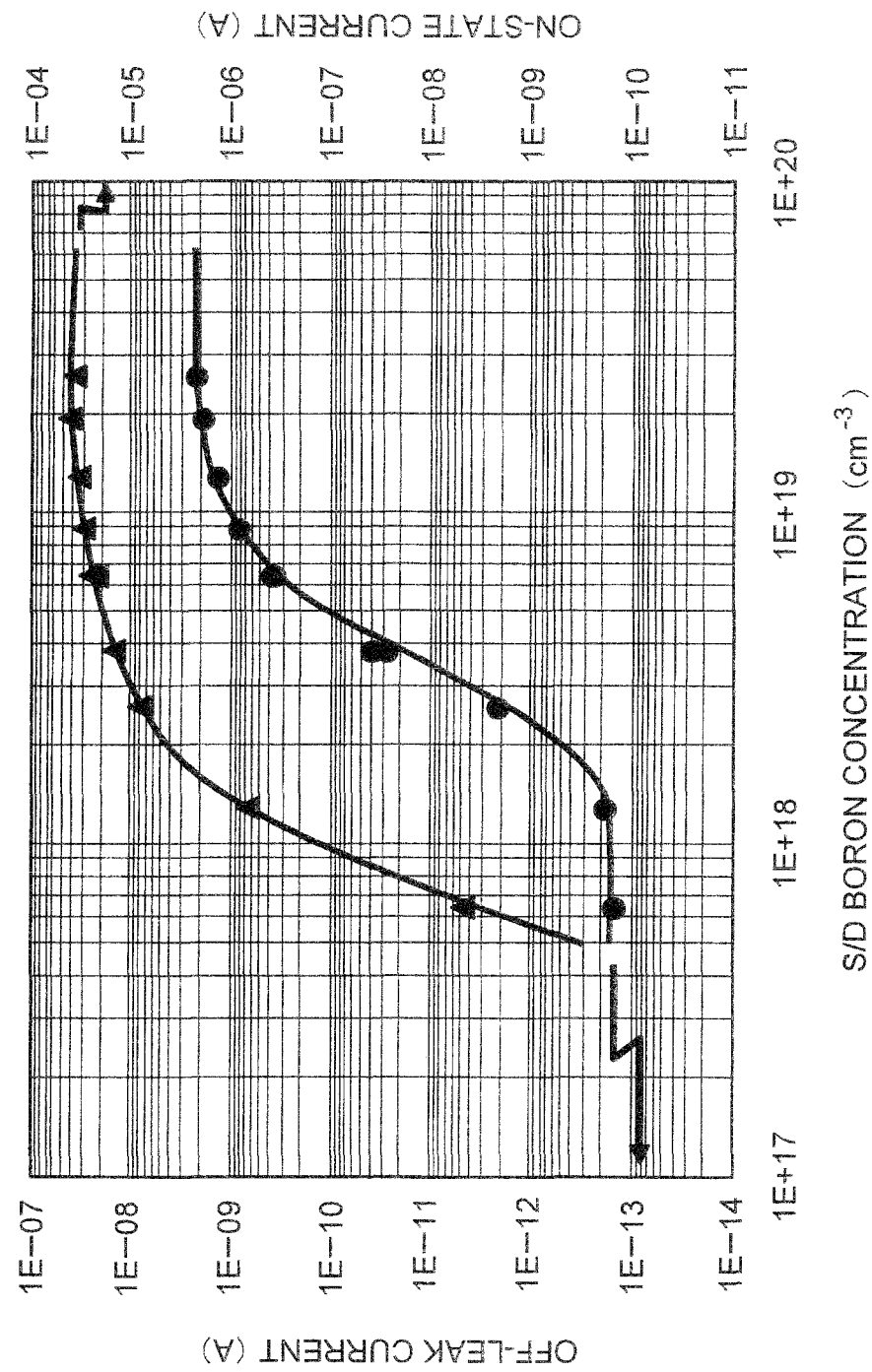
FIG. 2 is a graph showing S/D impurity concentration dependence of off-leak current and on-state current regarding a TFT having the same basic structure as that of the TFT shown in FIG. 1.
Figure 3:
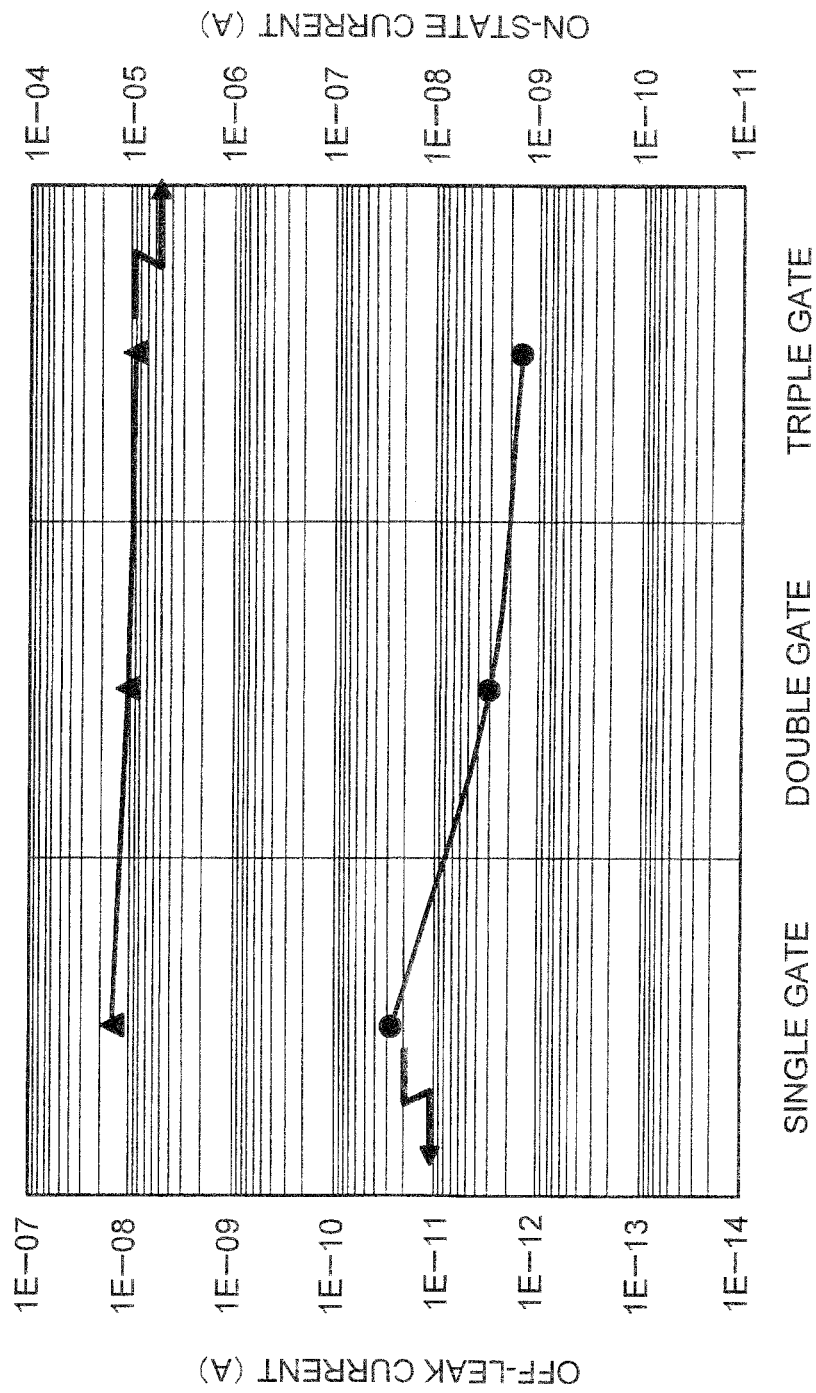
FIG. 3 is a graph showing gate structure dependence of off-leak current and on-state current regarding a TFT having the same basic structure as that of the TFT shown in FIG. 1.

FIG. 1 is a cross-sectional view showing a TFT in a drive circuit according to a first exemplary embodiment of the invention. FIG. 2 is a graph showing S/D impurity concentration dependence of off-leak current and on-state current regarding a TFT having the same basic structure as that of the TFT of FIG. 1. FIG. 3 is a graph showing gate structure dependence of off-leak current and on-state current regarding a TFT having the same basic structure as that of the TFT of FIG. 1. Description will be given below based on these drawings. Note that "S/D" is an abbreviation of "source region and drain region".

Although a TFT 10 shown in FIG. 1 is a pixel transistor, a drive circuit of the exemplary embodiment is configured with a TFT having the same basic structure as that of the TFT 10. In other words, the drive circuit of the exemplary embodiment is configured with the TFT 10 of a single conductivity type, forming a part of an active matrix substrate 29. In the TFT 10, the impurity concentration in a source region 17 and a drain region 18 is between $2*10^{18}$ cm$^{-3}$ and $2*10^{19}$ cm$^{-3}$. The TFT 10 has a structure in which a silicon film 14, a gate insulating film 15, and a gate electrode 16 are laminated in this order. The source region 17 and the drain region 18 are formed in the silicon film 14. The drive circuit configured with the TFT 10 is a gate line drive circuit made of a bootstrap scan circuit, for example.

Referring to FIG. 2, the vertical axis indicates off-leak current (A) and on-state current (A). For example, 1E-10 on the vertical axis indicates $1*10^{-11}$. The horizontal axis in FIG. 2 shows not a set dose amount but effective impurity concentration (cm$^{-3}$) which is effectively dosed in the silicon film 14. The TFT in FIG. 2 is of p-channel type and has a single drain structure, which are the same as the TFT 10. The dimensions of the TFT are as follows: the channel width and the channel length are 4 μm respectively, the film thickness of the gate insulating film is 120 nm, and the film thickness of the polycrystalline silicon film is 50 nm. "Off-leak current" is drain current when the drain voltage is −10 V and the gate voltage is +5 V. "On-state current" is drain current when the drain voltage is −10 V and the gate voltage is −10 V. Further, a used impurity is boron.

As obvious from FIG. 2, when the S/D impurity concentration is $2*10^{19}$ cm$^{-3}$ or less, off-leak current decreases rapidly. This means that a significant effect has been achieved by making the S/D impurity concentration to be $2*10^{19}$ cm$^{-3}$ or less. Note that when the S/D impurity concentration becomes $2*10^{18}$ cm$^{-3}$ or less, the off-leak current becomes about 20 pA or less while the on-state current decreases significantly, which may cause a trouble in the transistor operation. As such, the S/D impurity concentration is preferably between $2*10^{18}$ cm$^{-3}$ and $2*10^{19}$ cm$^{-3}$.

As described above, according to the exemplary embodiment, with the impurity concentration of the source region 17 and the drain region 18 of the TFT 10 being between $2*10^{18}$ cm$^{-3}$ and $2*10^{19}$ cm$^{-3}$, the off-leak current of the TFT 10 can be sufficiently reduced even with the single gate structure. As such, off-leak current of the TFT 10, required for the drive circuit configured with the TFT 10 of a single conductivity type, can be realized by simple manufacturing steps. Further, the single drain structure as the TFT 10 of the exemplary embodiment has an advantage such that light leak current caused when light is irradiated is smaller than that of an LDD structure. Accordingly, by adopting a single drain structure of a low S/D dose, an advantage that light leak current is reduced can also be achieved.

Referring to FIG. 3, the vertical axis indicates off-leak current (A) and on-state current (A). The horizontal axis in FIG. 3 indicates respective TFTs having a single gate structure, a double gate structure, and a triple gate structure, from the left. Each TFT is of a p-channel type in which the S/D impurity concentration is $4*10^{18}$ cm$^{-3}$. The TFT of a single gate structure has the same basic structure as that of the TFT 10 in FIG. 1. The TFT of a double gate structure has the same structure as that of the TFT of the single gate structure except that two gate electrodes are aligned in series. The TFT of a triple gate structure has the same structure as that of the TFT of the single gate structure except that three gate electrodes are aligned in series. The conditions for measuring off-leak current and on-state current are the same as the case of FIG. 2.

As obvious from FIG. 3, the double gate structure and the triple gate structure are able to suppress more off-leak current, compared with the single gate structure. As obvious from this result, a TFT may be a quadruple gate type, and further, may have the more number of gate electrodes.

Next, a method of manufacturing the TFT 10 will be described using FIG. 1.

First, on a transparent insulating substrate 11, a base nitride film 12 and a base oxide film 13 are laminated in order, and a silicon film 14 is deposited thereon. At this stage, an impurity for defining a channel concentration may be introduced into the silicon film 14 by ion doping as necessary. Then, the silicon film 14 is applied with heat treatment such as laser annealing so as to be poly-crystallized. Then, in order to electrically separate a plurality of transistors, the silicon film 14 is patterned in an island-shape using a photo-etching technique, and then a gate insulating film 15 is disposed. Then, a gate electrode material is disposed and a gate electrode 16 is formed using a photo-etching technique.

Then, by using ion doping with the gate electrode 16 being a mask, low concentration boron is introduced into the silicon film 14. As the conditions of the ion doping, an acceleration voltage is 80 keV, and a set dose amount is within a range between $5*10^{12}$ cm$^{-2}$ and $2*10^{14}$ cm$^{-2}$. Consequently, the source region 17 and the drain region 18 are formed with the impurity concentration between $1*10^{18}$ cm$^{-3}$ and $4*10^{19}$ cm$^{-3}$ (preferably, between $2*10^{18}$ cm$^{-3}$ and $2*10^{19}$ cm$^{-3}$).

Then, an inter-layer insulating film 19 is deposited, and in order to mainly activate the source region 17 and the drain region 18, heat treatment is performed at 450° C. Then, hydrogenation is performed by exposing the entire substrate into hydrogenated plasma. At this stage, termination of dangling-bond existing in the grain boundary of the silicon film 14 made of polycrystalline silicon and termination of dangling-bond existing in the boundary between the silicon film 14 and the gate insulating film 15 are particularly promoted to thereby improve the electric current transmission property. Then, contact holes 20 are formed above the source region 17 and the drain region 18, and wires 21 and 22 and insulating films 23 and 24 are formed thereon. The wires 21 and 22 contacting the source region 17 work as the source electrode 27, and the wires 21 and 22 contacting the drain region 18 work as the drain electrode 28.

Finally, a contact hole 25 is formed above the wire 22, and a wire 26 is further formed thereon. Thereby, the active matrix substrate 29 including the TFT 10 is completely formed.

The characteristics of the p-channel type TFT 10 manufactured using the manufacturing steps described above are as shown in FIGS. 2 and 3. As a result, it is found that off-leak current of the TFT 10 can be significantly suppressed with the effective boron concentration of $2*10^{19}$ cm$^{-3}$ or less.

Next, operation and effects of the drive circuit according to the exemplary embodiment will be described.

In the exemplary embodiment, the TFT 10 in which the S/D impurity concentration is reduced is used for every p-channel type pixel transistor and drive circuit configured with a p-channel type TFT. Thereby, as the electric field at the drain end can be small in an off state in each TFT 10, a tunneling phenomenon from the valence band to the conduction band can be suppressed.

An S/D impurity concentration means an impurity (dopant) concentration injected in the source region 17 and the drain region 18 in the silicon film 14. According to the TFT 10, as a tunneling phenomenon via the in-gap level unique to polycrystalline silicon formed on the glass substrate can be suppressed. Consequently, off-leak current can be reduced without providing an LDD region between the channel region 14a and the drain region 18. As the parasitic resistance increases when the S/D impurity concentration decreases, the S/D impurity concentration cannot be reduced blindly. However, by overlapping the source region 17 and the drain region with the gate electrode 16, an increase in the parasitic resistance can be suppressed (see second exemplary embodiment).

As described above, according to the exemplary embodiment, in the configuration in which a drive circuit also consists of a TFT having the same conductivity type as that of the pixel transistor, off-leak current can be reduced by making the S/D impurity concentration to be $2*10^{19}$ cm$^{-3}$ or less with respect to the TFTs of both the pixel transistor and the drive circuit, and preferably, to all TFTs. Further, by using a double gate structure or a triple gate structure with a condition of S/D impurity concentration being small, off-leak current can be further reduced.

When off-leak current is large, a voltage written into a pixel storage capacitor and a pixel capacitor becomes lowered, causing problems of lower contrast, bright point defect, scotoma defect, malfunction of a gate line driving circuit, and the like. With the configuration of the exemplary embodiment, however, these problems can be solved. Note that if the S/D impurity concentration is further reduced so as to be $2*10^{18}$ cm$^{-3}$ or less, on-state current will be significantly reduced, whereby troubles will be caused in the transistor operation.

As described above, according to the exemplary embodiment, off-leak current can be reduced by lowering the S/D impurity concentration with a low S/D dose so as to suppress the electric field of the drain end. However, this increases electric resistance of the source region 17 and the drain region 18. That is, as the parasitic resistance increases, reduction of on-state current may become a problem. One method to avoid this problem as much as possible is aging which will be described in sixth and seventh exemplary embodiments described later.

Some other methods can be carried out besides the above-described one. A first method is to increase the widths of the source region 17 and the drain region 18 compared with the width of the channel region 14a so as to reduce the parasitic resistance as much as possible. A second method is to reduce a distance from a junction region formed in the boundary between the channel region 14a and the source region 17 and the drain region 18 to the contact hole 20 as much as possible up to the extent capable of avoiding a problem due to manufacturing tolerance. A third method is to increase the diameter of the contact hole 20 as much as possible. Specifically, the third method is to increase the diameter of the contact hole 20 to the same length as the channel width, and preferably to be larger than the channel width. Particularly, regarding the shape of the contact hole 20, the method is to increase the length in the channel width direction to be longer than the length in the channel length direction.

Although the impurity used in the exemplary embodiment is boron, other elements of the third group may be used, of course. Further, although the TFT 10 is of a p-channel type, the same operation and effects can be achieved with that of an n-channel type.

As an exemplary advantage according to the invention, with the impurity concentration of the source region and the drain region of the TFT being between $2*10^{18}$ cm$^{-3}$ and $2*10^{19}$ cm$^{-3}$, off-leak current of the TFT can be sufficiently reduced even with a single gate structure. Thereby, off-leak current of the TFT, required for a drive circuit configured with a TFT of a single conductivity type, can be realized with simple manufacturing steps.

(Second Exemplary Embodiment)

Figure 4:
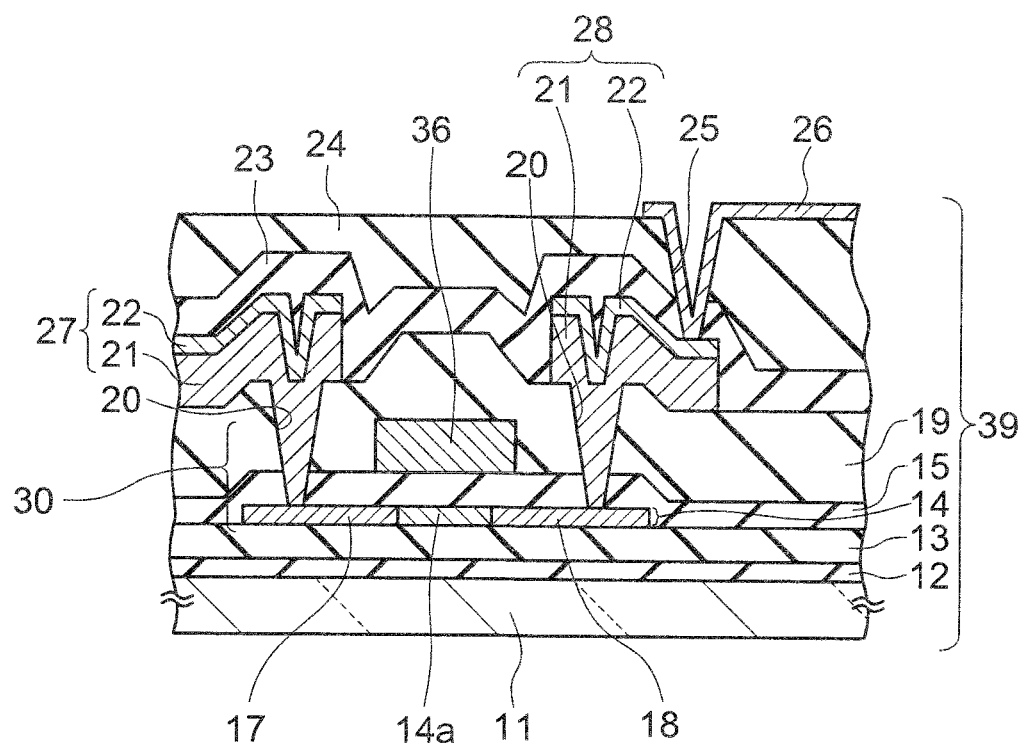
FIG. 4 is a cross-sectional view showing a TFT of a drive circuit according to a second exemplary embodiment.

FIG. 4 is a cross-sectional view showing a TFT in a drive circuit according to a second exemplary embodiment of the invention. Hereinafter, description will be given based on FIG. 4. Note that the same components as those in FIG. 1 are denoted by the same reference numerals and their descriptions are not repeated herein.

Although a TFT 30 shown in FIG. 4 is a pixel transistor, a drive circuit of the exemplary embodiment is configured with a TFT having the same basic structure as that of the TFT 30. In other words, the drive circuit of the exemplary embodiment is configured with the TFT 30 of a single conductivity type, forming a part of an active matrix substrate 39. In the TFT 30, the impurity concentration of the source region 17 and the drain region 18 is between $2*10^{18}$ cm$^{-3}$ and $2*10^{19}$ cm$^{-3}$. Further, the TFT 30 has a structure in which a silicon film 14, a gate insulating film 15, and a gate electrode 36 are laminated in this order, and at least a part of the gate electrode 36 and at least a part of the source region 17 and the drain region 18 formed in the silicon film 14 are overlapped via the gate insulating film 15. As such, as the channel under the gate insulating film 15 directly contacts the source region 17 or the drain region 18, source resistance or drain resistance is reduced. The drive circuit configured with the TFT 30 is a gate line drive circuit made of a bootstrap scan circuit, for example.

Next, a method of manufacturing the TFT 30 will be described.

In the exemplary embodiment, low concentration boron is introduced using a photoresist as a mask before the gate electrode 36 is formed to thereby form the source region 17 and the drain region 18. This means, before depositing the gate insulating film 15, low concentration boron is introduced by ion doping using a photoresist as a mask, to thereby form the source region 17 and the drain region 18. The impurity concentration at this point is between $1*10^{18}$ cm$^{-3}$ and $4*10^{19}$ cm$^{-3}$, and preferably between $2*10^{18}$ cm$^{-3}$ and $2*10^{19}$ cm$^{-3}$.

It is also acceptable to form a sacrifice layer before doping, and add a process of removing the sacrifice layer after doping. As the thickness of the sacrifice layer is generally thin, an acceleration voltage of 20 keV is used for ion doping for example, because a so-called through oxide film is thin. In that case, heat treatment may be performed at 450° C. for activating the source region 17 and the drain region 18 before formation of the gate electrode 36, followed by hydrogenation.

Then, the gate electrode 36 is formed. At this point, as the gate electrode 36 is overlapped with the source region 17 and the drain region 18, a secondary effect of reducing displacement between a photoresist for forming the source region 17 and the drain region 18 and a photoresist for forming the gate electrode 36 can also be achieved.

Note that even in the exemplary embodiment, an activation process and a hydrogenation process can be performed after the deposition of the interlayer insulating film 19, which is the same as the first exemplary embodiment. Thereby, the active matrix substrate 39 including the TFT 30 is completely formed.

Even in the TFT 30 formed as described above, when measuring off-leak current and the like with the horizontal axis indicating effective boron concentration or gate structure, the same characteristics as those shown in FIGS. 2 and 3 were obtained. As such, in the TFT 30, off-leak current can be significantly suppressed with the S/D impurity concentration of $2*10^{19}$ cm$^{-3}$ or less.

In addition, as the portion overlapping the gate electrode 36 via the gate insulating film 15, in the source region 17 and the drain region 18, does not work as parasitic resistance (resistance is decreased) in an on-state of the TFT 30, a decrease in on-state current can be suppressed. As such, according to the exemplary embodiment, a drive circuit including the TFT having high driving capability can be achieved while suppressing off-leak current. Other configurations, operations and effects of the exemplary embodiment are the same as those of the first exemplary embodiment.

(Third Exemplary Embodiment)

Figure 5:
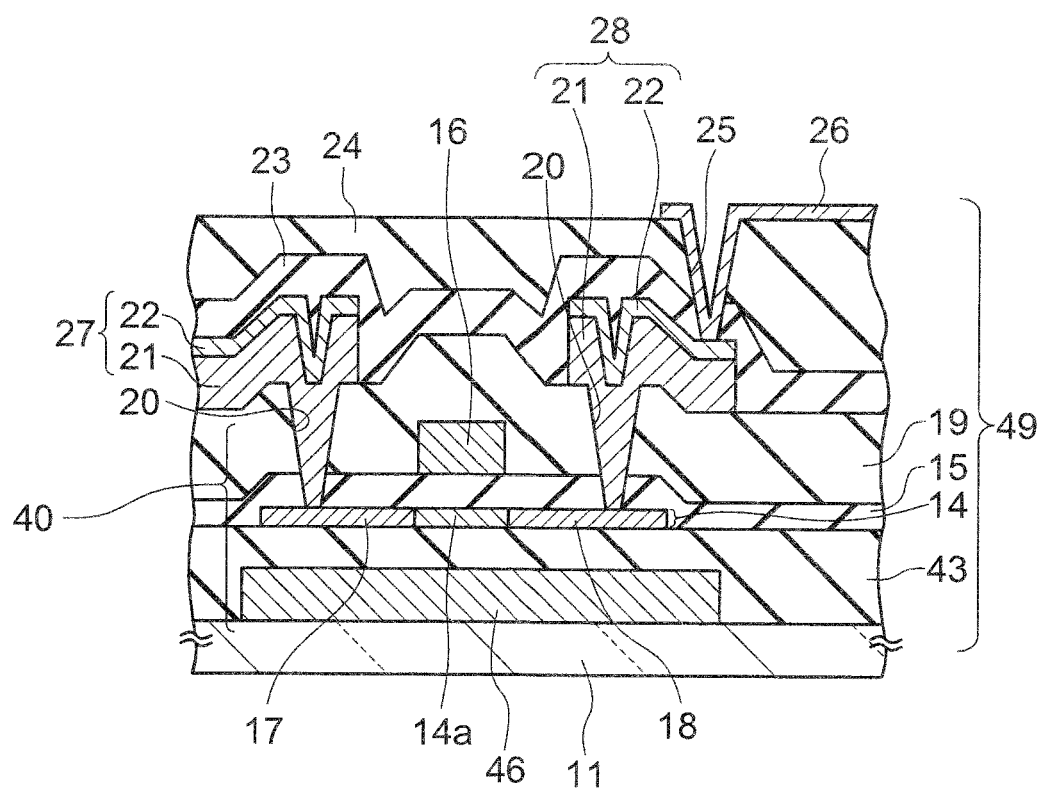
FIG. 5 is a cross-sectional view showing a TFT of a drive circuit according to a third exemplary embodiment.

FIG. 5 is a cross-sectional view showing a TFT in a drive circuit according to a third exemplary embodiment of the invention. Hereinafter, description will be given based on FIG. 5. Note that the same components as those in FIG. 1 are denoted by the same reference numerals and their descriptions are not repeated herein.

Although a TFT 40 shown in FIG. 5 is a pixel transistor, a drive circuit of the exemplary embodiment is configured with a TFT having the same basic structure as that of the TFT 40. In other words, the drive circuit of the exemplary embodiment is configured with the TFT 40 of a single conductivity type, forming a part of an active matrix substrate 49. In the TFT 40, the impurity concentration of the source region 17 and the drain region 18 is between $2*10^{18}$ cm$^{-3}$ and $2*10^{19}$ cm$^{-3}$. Further, the TFT 40 has a structure in which an auxiliary gate electrode 46, an auxiliary gate insulating film 43, a silicon film 14, a gate insulating film 15, and a gate electrode 16 are laminated in this order, and at least a part of the auxiliary gate electrode 46 and at least a part of the source region 17 and the drain region 18 formed in the silicon film 14 are overlapped via the auxiliary gate insulating film 43. The auxiliary gate electrode 46 and the gate electrode 16 are connected to each other by a conductor in a part not shown so as to be electrically short circuited. The drive circuit configured with the TFT 40 is a gate line drive circuit made of a bootstrap scan circuit, for example.

In the exemplary embodiment, in order to suppress reduction of on-state current in the TFT due to low S/D dose, the auxiliary gate electrode 46 is provided in addition to the gate electrode 16. The auxiliary gate electrode 46 is provided on the opposite side to the gate electrode 16 with reference to the silicon film 14, via the auxiliary gate insulating film 43. In other words, the exemplary embodiment is configured such that the same voltage as that applied to the gate electrode 16 is also applied to the other auxiliary gate electrode 46. According to the exemplary embodiment, as a channel is also formed on the auxiliary gate electrode 46 side in addition to the gate electrode 16 side of the silicon film 14$a$, a decrease in on-state current can be suppressed even if the introduction amount of impurity in the source region 17 and the drain region 18 is reduced. Other configurations, operations and effects of the exemplary embodiment are the same as those of the first exemplary embodiment.

(Fourth Exemplary Embodiment)

Figure 6:
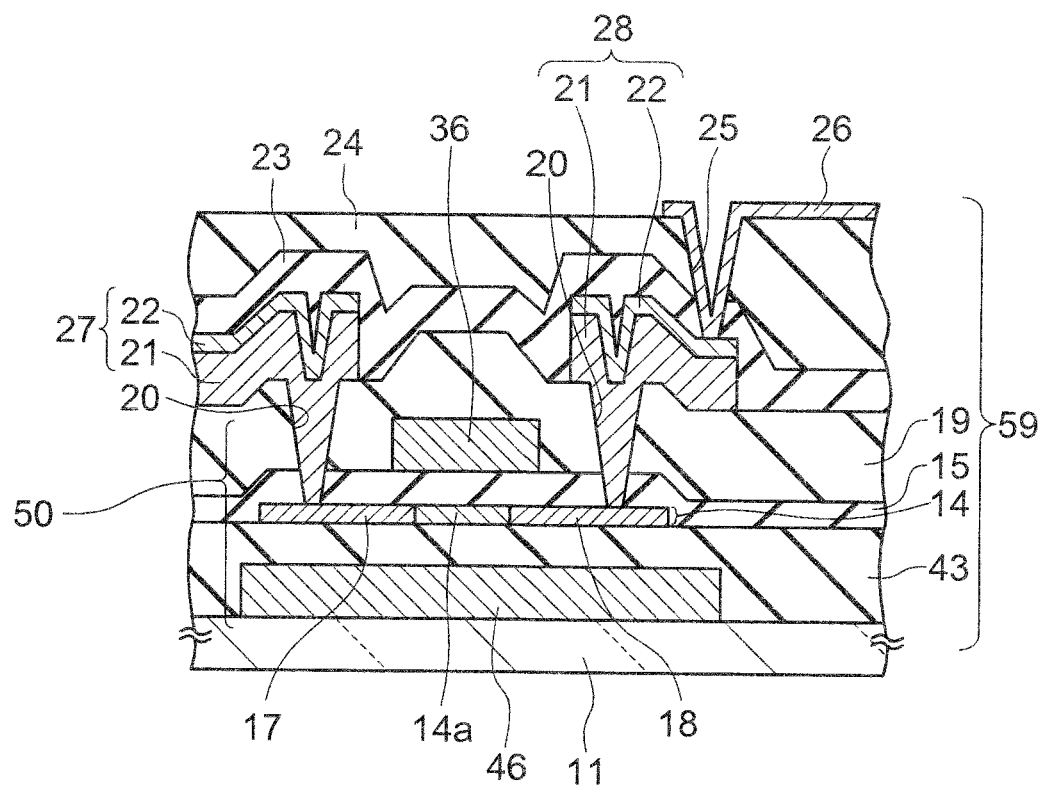
FIG. 6 is a cross-sectional view showing a TFT of a drive circuit according to a fourth exemplary embodiment.

FIG. 6 is a cross-sectional view showing a TFT in a drive circuit according to a fourth exemplary embodiment of the invention. Hereinafter, description will be given based on FIG. 6. Note that the same components as those in FIGS. 4 and 5 are denoted by the same reference numerals and their descriptions are not repeated herein.

Although a TFT 50 shown in FIG. 6 is a pixel transistor, a drive circuit of the exemplary embodiment is configured with a TFT having the same basic structure as that of the TFT 50. In other words, the drive circuit of the exemplary embodiment is configured with the TFT 50 of a single conductivity type, forming a part of an active matrix substrate 59. In the TFT 50, the impurity concentration of the source region 17 and the drain region 18 is between $2*10^{18}$ cm$^{-3}$ and $2*10^{19}$ cm$^{-3}$. Further, the TFT 50 has a structure in which an auxiliary gate electrode 46; an auxiliary gate insulating film 43, a silicon film 14, a gate insulating film 15, and a gate electrode 36 are laminated in this order, and at least a part of the gate electrode 36 and at least a part of the source region 17 and the drain region 18 are overlapped via the gate insulating film 15, and at least a part of the auxiliary gate electrode 46 and at least a part of the source region 17 and the drain region 18 are overlapped via the auxiliary gate insulating film 43. The source region 17 and the drain region 18 are formed in the silicon film 14. The auxiliary gate electrode 46 and the gate electrode 36 are connected to each other by a conductor in a part not shown so as to be electrically short circuited. The drive circuit configured with the TFT 50 is a gate line drive circuit made of a bootstrap scan circuit, for example.

The auxiliary gate electrode 46 is provided on the opposite side to the gate electrode 36 with reference to the silicon film 14, via the auxiliary gate insulating film 43. The gate electrode 36 is overlapped with the source region 17 and the drain region 18, via the gate insulating film 15. Thereby, when an on-state voltage is applied to the gate electrode 36, the carrier concentration of the overlapped source region 17 and the drain region 18 increases, so that resistance in the source region 17 and the drain region 18 decreases. According to the exemplary embodiment, a decrease in on-state current can be suppressed even if the introduction amount of the impurity in the source region 17 and the drain region 18 is reduced. Other configurations, operations and effects of the exemplary embodiment are the same as those of the second and third exemplary embodiments.

(Fifth Exemplary Embodiment)

Next, an active matrix substrate and a liquid crystal display device according to a fifth exemplary embodiment of the invention will be described based on FIGS. 7 to 10.

Figure 7:
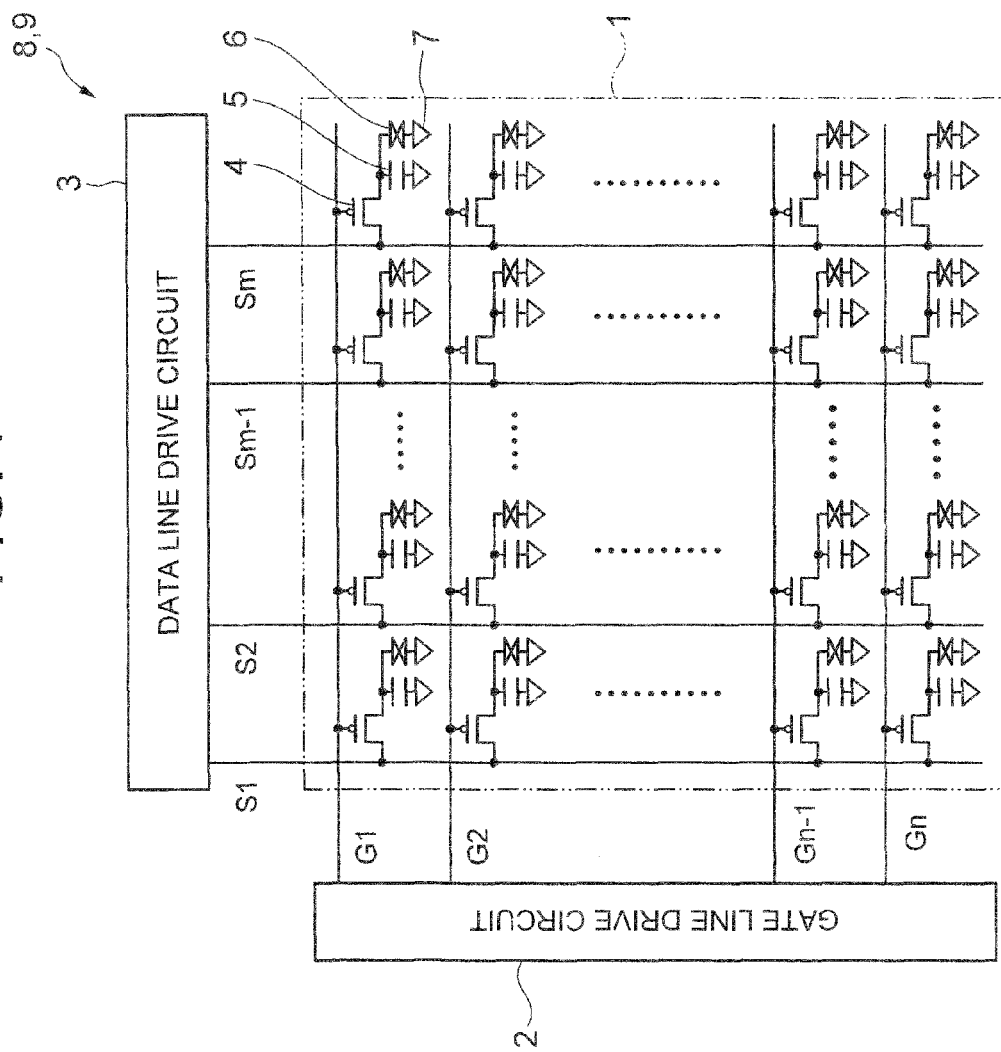
FIG. 7 is a block diagram and a circuit diagram showing an active matrix substrate and a liquid crystal display device according to a fifth exemplary embodiment.

An active matrix substrate 8 of the exemplary embodiment, shown in FIG. 7, basically includes a plurality of gate lines G1 to Gn, a plurality of data lines S1 to Sm, pixel transistors 4 provided at respective nodes between the gate lines G1 to Gn and the data lines S1 to Sm, and a gate line drive circuit 2 which sequentially applies drive voltages to the gate lines G1 to Gn. The gate line drive circuit 2 is one of the drive circuits of the first to fourth exemplary embodiments described above. TFTs configuring the pixel transistors 4 and the gate line drive circuit 2 are p-channel type TFTs, and the impurity concentration of the source region and the drain region of this p-channel type TFT is between $2*10^{18}$ cm$^3$ and $2*10^{19}$ cm$^{-3}$.

A liquid crystal display device 9 of the exemplary embodiment, as shown in FIG. 7, includes the active matrix substrate 8, a counter substrate (common electrode 9) opposite the active matrix substrate 8, and liquid crystal (pixel capacitor 6) interposed between the counter substrate and the active matrix substrate 8.

Hereinafter, the active matrix substrate 8 and the liquid crystal display device 9 will be described in more detail.

As shown in FIG. 7, the active matrix substrate 8 includes a pixel unit 1, the gate line drive circuit 2, and a data line drive circuit 3. The pixel unit 1, the gate line drive circuit 2, and the data line drive circuit 3 are configured only with p-channel type TFTs on the same glass substrate.

In the pixel unit 1, the gate lines G1 to Gn and the data lines S1 to Sm are formed at right angles to each other. The respective gate lines G1 to Gn are connected with corresponding terminals of the gate line drive circuit 2. The respective data lines S1 to Sm are connected with corresponding terminals of the data line drive circuit 3. At each of the nodes between the gate lines G1 to Gn and the data lines S1 to Sm in the pixel unit 1, a pixel circuit configured with a pixel transistor 4 which is a polycrystalline silicon TFT, a pixel storage capacitor 5, and a pixel capacitor 6 made of liquid crystal, is disposed.

The gate line drive circuit 2 is configured with a scan circuit consisting of a p-channel type TFT fabricated through the same manufacturing process as that of the pixel transistor 4. To the scan circuit configuring the gate line drive circuit 2, a vertical start pulse ST and clock signals are input from the outside, and the scan circuit outputs output signals in which the vertical start pulse ST is synchronized with the clock signals and phase-shifted by one stage, whereby the pixel circuit connected to the common gate line is in a conducting state, so that a video signal to be output to the data line is taken into the pixel circuit.

Figure 8:
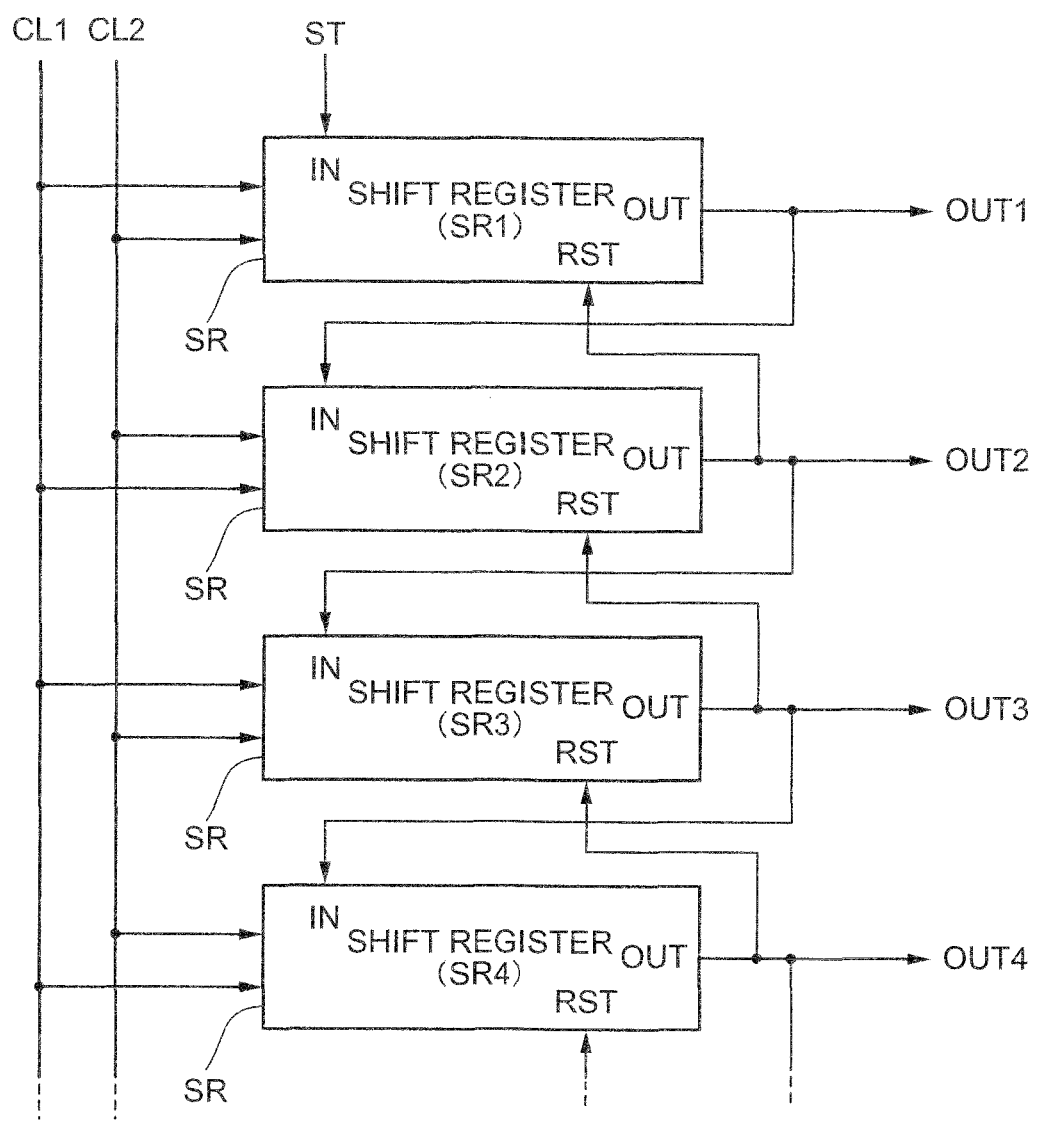
FIG. 8 is a block diagram showing a scan circuit configuring a gate line drive circuit of FIG. 7.

FIG. 8 shows the configuration of the scan circuit of the gate line drive circuit 2. To the scan circuit of the gate line drive circuit 2 shown in FIG. 8, two clock signals CL1 and CL2 and a vertical start pulse signal ST are input from the outside. The scan circuit of the gate line drive circuit 2 shown in FIG. 8 includes a plurality of shift registers SR (SR1, SR2, SR3, SR4, . . . ) connected in series.

In the shift register SR1 at the first stage, the vertical pulse signal ST is input to the input terminal IN, and in each of the shift registers SR2, SR3, SR4, . . . at the second and following stages, an output signal OUT of the previous stage is input to an input terminal IN. Also, two clock signals CL1 and CL2 are input to the respective shift registers.

The shift register SR1 at the first stage outputs an output signal OUT1, in which the vertical start pulse signal ST is phase-shifted, by the clock signal CL1. The next shift register SR2 outputs an output signal OUT2, in which the output from the shift register SR1 is phase-shifted, by the clock signal CL2. Thereafter, outputs are phase-shifted in synchronization with the clock signal in the same manner and the vertical start pulse signal ST is sequentially transferred.

Figure 9:
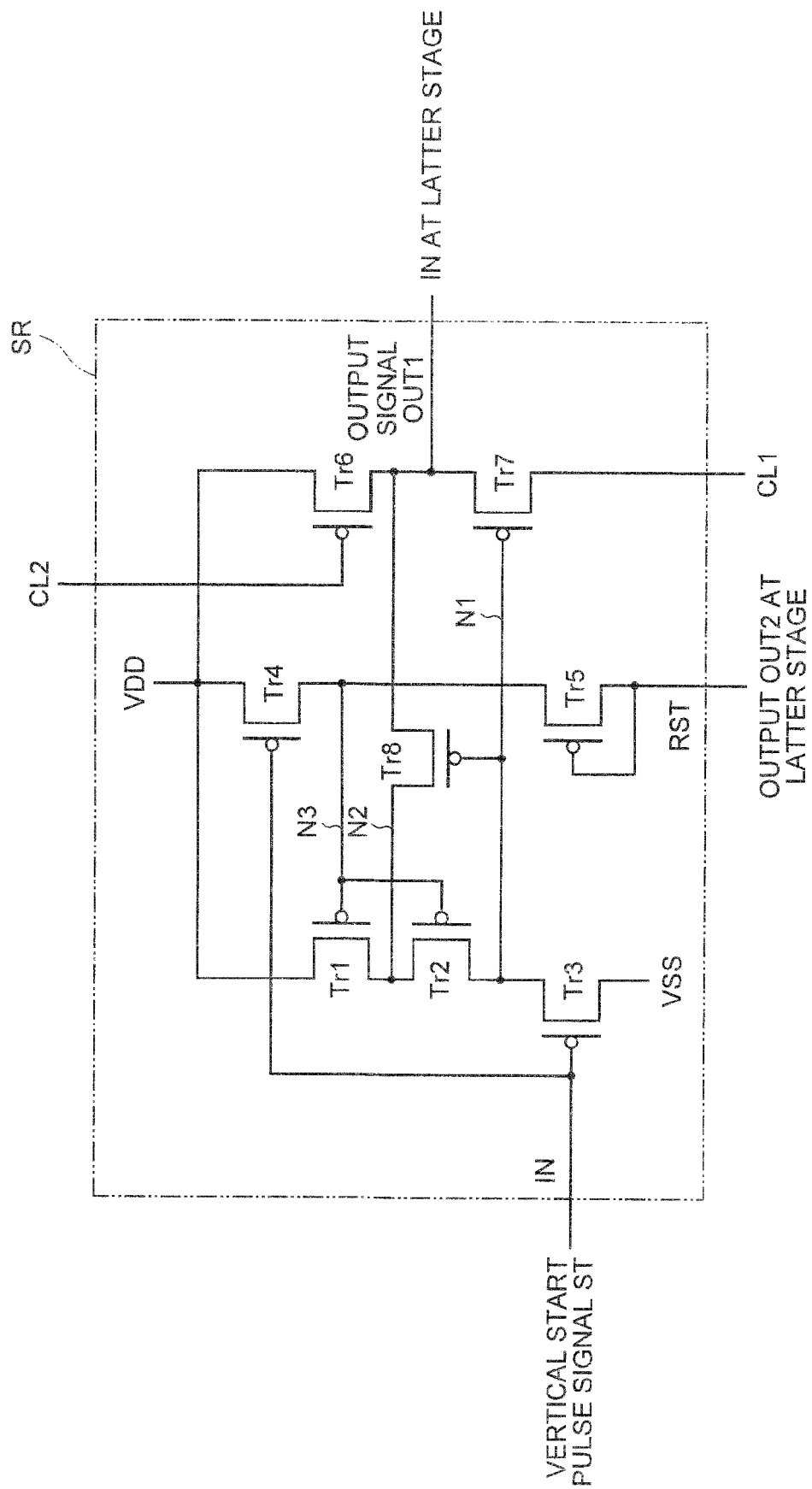
FIG. 9 is a circuit diagram showing a shift register configuring the scan circuit of FIG. 8.

FIG. 9 shows an internal circuit of the shift register SR1. Although FIG. 9 shows the shift register SR1 at the first stage, the circuit configuration of the shift registers SR2, SR3, SR4, . . . at the following stages are the same, except for a signal to be input. Specifically, in the shift register SR2, an output signal OUT1 of the previous stage is input to the input terminal IN instead of the vertical start pulse signal ST, the clock signal CL2 is input instead of the clock signal CL1, and the clock signal CL1 is input instead of the clock signal CL2.

In each of the following shift registers, an output signal OUT of the previous stage is input to the input terminal IN, and the clock signals are alternately input at the respective stages.

The shift register SR1 shown in FIG. 9 includes eight pieces of p-channel type transistors Tr1 to Tr8. The transistor Tr3 is in a conducting state when the vertical start pulse signal ST input to the input terminal IN is at a low level, and supplies a voltage of the VSS power source to a node N1. When the voltage of the VSS power source is the same voltage as that of the low level, a voltage raised by a threshold Vt from the low level is supplied to the node N1. Although the voltage of the VSS power source is the same voltage as that of the low level in this exemplary embodiment, the voltage may be different. Further, it is also acceptable to use the vertical start pulse signal ST input to the gate electrode (input terminal IN) of the transistor Tr3, in place of the voltage of the VSS power source.

The transistor Tr5 is in a conducting state when the output signal OUT 2 from the shift resister SR2 of the latter state is at a low level, and a voltage raised by the threshold Vt from the low level is supplied to a node N3. The transistor Tr6 is in a conducting state when the clock signal CL2 is at a low level, and a high level voltage (voltage of VDD power source) is supplied as an output signal OUT1. The transistor Tr7 is in a conducting state when the voltage of the node N1 is low (bootstrap voltage lower than VSS+Vt or low level), to which the voltage of the clock signal CL1 is supplied as an output signal OUT1.

As the transistors Tr6 and Tr7 drive a capacitive load connected to the output terminal of the shift register SR1, the current drive capability thereof is enhanced by setting the channel width to be larger by one digit or more compared with the other transistors Tr1 to Tr5. The transistor Tr4 is in a conducting state when the vertical start pulse signal ST is at a low level, and a high level voltage is supplied to a node N3. The transistors Tr1 and Tr2 are in a conducting state when the voltage of the node N3 is VSS+Vt, and a high level voltage is supplied to the node N1. The transistor Tr8 is in a conducting state when the voltage of the node N1 is at a low voltage (bootstrap voltage lower than VSS+Vt or low level), and a voltage as an output signal OUT1 is supplied to a node N2 which is a connection node of the transistors Tr1 and Tr2.

When the voltage of the output signal OUT1 is supplied to the node N2 by the transistor Tr8, the voltage applied between the source and the drain of the transistors Tr1 and Tr2 becomes the power source voltage or lower (=voltage difference between high level and low level). In other transistors Tr3 to Tr8, as the voltage applied between the source and the drain is the power source voltage or lower, the condition of power source voltage or lower is satisfied in all of the transistors Tr1 to Tr8.

Figure 10:
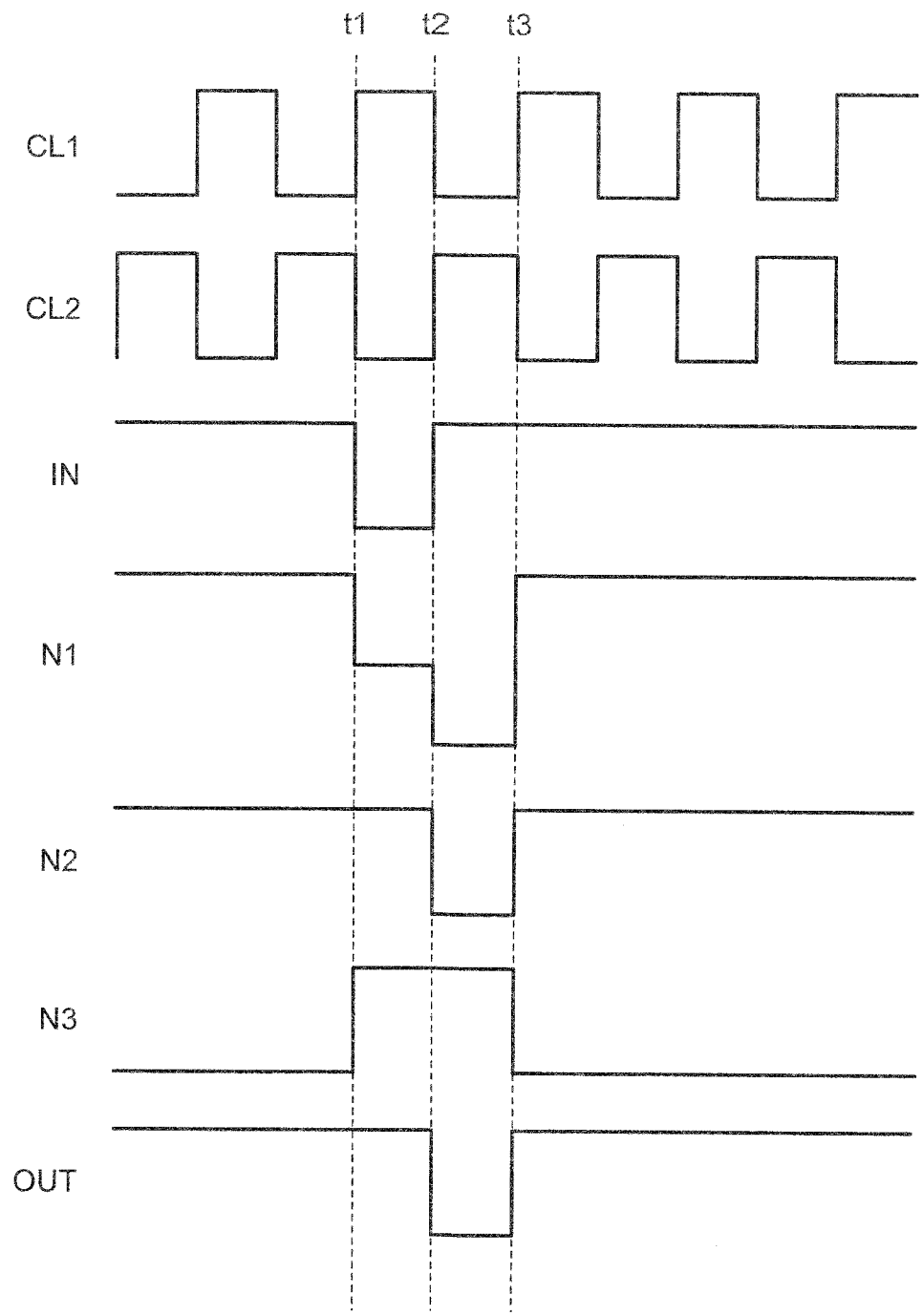
FIG. 10 is a timing chart showing the operation of the shift register of FIG. 9.

Next, operation of a shift register will be described using a timing chart of FIG. 10. In FIG. 10, a high level voltage of the clock signals CL1 and CL2 and the vertical start pulse signal ST is VDD, and a low level voltage thereof is VSS.

Operation of the shift register SR1 will be described with reference to FIG. 10. First, at time t1 in FIG. 10, when the vertical start pulse signal ST becomes a low level, the transistors Tr3 and Tr4 are in a conducting state. Along with it, the voltage of the node N1 changes from the low level voltage of the vertical start pulse signal ST to a voltage raised by the threshold Vt. Further, the node N3 becomes a high level.

At this point, although the transistor Tr7 is in a conducting state, as the clock signal CL1 is at a high level, the output signal OUT1 maintains the high level. Further, as the clock signal CL2 is at a low level, a high level voltage is also supplied from the transistor Tr6.

Then, at a time t2, the clock signal CL1 changes to a low level. Then, as capacitance exists between the gate and the drain electrodes and the gate and the source electrodes of the transistor Tr7, the voltage of the node N1 is lowered to a voltage lower than VSS+Vt due to a bootstrap effect by each capacitance so as to become a voltage lower than the low level. As a result, a voltage of the threshold voltage or higher is applied between the gate and the source of the transistor Tr7. As such, the transistor Tr7 maintains a conducting state, and supplies the low level voltage of the clock signal CL1 as an output signal OUT1.

Then, at time t3, the voltage of the output signal OUT2 at the latter stage changes to the low level. Then, the transistor Tr5 becomes to be in a conducting state, and the voltage of the node N3 changes from the high level voltage to the voltage of VSS+Vt which is raised by the threshold Vt from the low level voltage; As a result, the transistors Tr1 and Tr2 become a conducting state, and the voltage of the node N1 changes from the low level to the high level. At this time, as the voltage difference between the gate and the source of the transistor Tr7 becomes zero, the transistor Tr7 becomes a non-conducting state.

After the time t3, as the clock signal CL2 is input to the transistor Tr6 at a constant frequency, the output signal OUT1 maintains the high level. Further, as the node N3 maintains the voltage of VSS+Vt by the gate capacitance of the transistors Tr1 and Tr2 until the next low-level vertical start pulse signal ST is input, the transistors Tr1 and Tr2 are in a conducting state. As such, as the voltage of the node N1 is at a high level from the time t3 at which the vertical start pulse signal ST of the next low level is input until the next time t1, the voltage between the gate and the source of the transistor Tr7 is set to zero, so that the transistor Tr7 is in a non-conducting state.

As described above, as there is no path through which current flows from a positive power source (high level) to a negative power source (low level) at every time in the configuration of the present drive circuit, a circuit of low power consumption is realized.

Although the operation of the shift register SR1 has been described, the same operation will be performed in the shift registers SR2, SR3, SR4, . . . other than the shift register SR1, except for signals to be input. Consequently, the vertical start pulse signal ST is sequentially phase-shifted and output by the shift registers.

Note that, in the gate line drive circuit 2, although it has been described that "the node N3 maintains the voltage of VSS+Vt by the gate capacitance of the transistors Tr1 and Tr2", it has been found that if off-leak current of the transistor Tr4 or Tr5 is large, the voltage cannot be maintained so that malfunction is caused. In the exemplary embodiment, however, by using only a TFT of a p-channel type according to any one of the first to fourth exemplary embodiments, off-leak current of the TFT configuring the gate line drive circuit 2 can be reduced, so that the high-definition active matrix substrate 8 which is not subjected to malfunction can be fabricated.

Further, even for the pixel transistor 4 of the pixel unit 1, a characteristic that off-leak current is small is required in order to sufficiently secure charges in the pixel storage capacitor 5 and the pixel capacitor 6. In contrast, in the exemplary embodiment, as off-leak current can be suppressed to all TFTs by using only TFTs of p-channel type according to any one of the first to fourth exemplary embodiments is used, the high-definition active matrix substrate 8 with no display irregularities and flickers can be fabricated.

Note that although the active matrix substrate 8 of the exemplary embodiment is only configured with p-channel type TFTs, the active matrix substrate 8 may be configured with n-channel type TFTs. Even in that case, the same operation and effects as those of the exemplary embodiment can be achieved. Further, the active matrix substrate 8 is not limited to liquid crystal, and can be used for other display device such as EL (Electroluminescence).

(Sixth Exemplary Embodiment)

Figure 11:
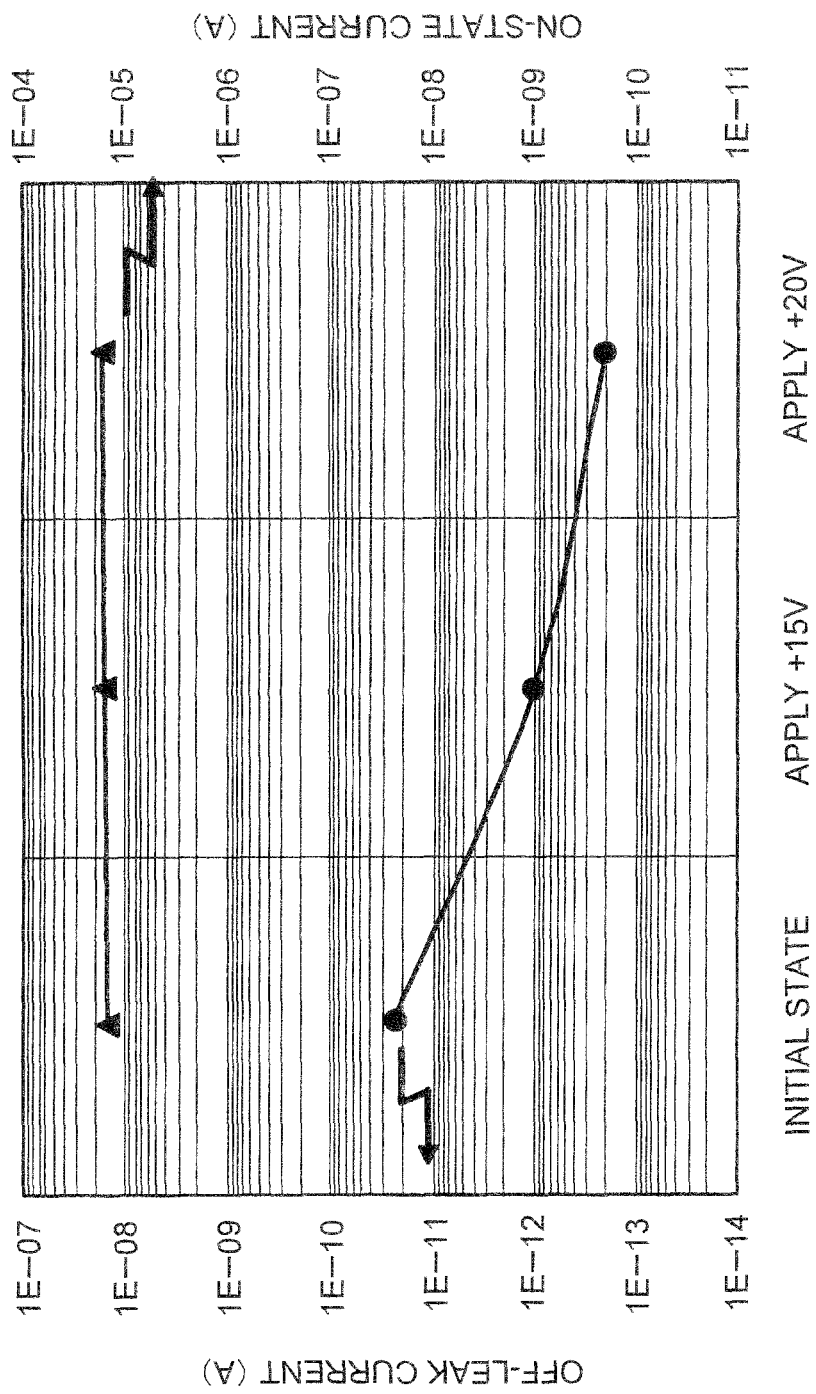
FIG. 11 is a graph showing effects of a method of reducing off-leak current of a TFT according to a sixth exemplary embodiment.

FIG. 11 is a graph showing effects of a method of reducing off-leak current of a TFT according to a sixth exemplary embodiment. Hereinafter, description will be given based on FIGS. 1 and 11.

Description will be given using the TFT 10 shown in FIG. 1. It has been known that when a deep (large absolute value) off-state voltage is applied to the gate electrode 16 in a state where the potentials of the source electrode 27 and the drain electrode 28 do not coincide, off-leak current is reduced (see, for example, Technical Digest of AM-FPD2007, pp. 227-230). This is because that carrier is injected or trapped in the gate insulating film 15 or in the boundary between the gate insulating film 15 and the silicon film 14 due to the strong electric field at the drain end, and consequently, a positive fixed charge is caused in that portion. Hereinafter, off-leak reduction in the exemplary embodiment will be referred to as an "aging effect". As the aging effect can be achieved by applying a deep off-state voltage to the gate electrode 16 beforehand, an active matrix substrate having the TFT 10 in which off-leak current is reduced can be manufactured.

Further, when the polarity of the voltage difference between the source electrode 27 and the drain electrode 28 is reversed, reduction effect of the off-leak current is not obtained with respect to the voltage of the reversed polarity. As such, it is preferable to perform aging in the same manner while replacing the voltages applied to the source electrode 27 and the drain electrode 28.

Hereinafter, a method of reducing off-leak current according to the exemplary embodiment will be described in more detail.

In the method of reducing off-leak current of the exemplary embodiment, an off-state voltage having a larger absolute value than that of a normal off-state voltage is applied to the gate electrode 16 before a normal off-state voltage is applied to the gate electrode 16 of the TFT 10. At this point, when applying an off-state voltage having a larger absolute value than that of a normal off-state voltage to the gate electrode 16, a constant voltage or a pulse voltage in which the polarity is reversed is applied between the source electrode 27 and the drain electrode 28.

In FIG. 11, the vertical axis shows off-leak current and on-state current, and the horizontal axis shows an off-state voltage. In the horizontal axis, an initial state means a state where a "normal off-state voltage (+10 V, for example)" is applied, and a voltage of +15 V or +20 V is an "off-state voltage having a larger absolute value than that of a normal off-state voltage".

Now, it is assumed that either one of the source electrode 27 and the drain electrode 28 is an electrode A, and the other one is an electrode B. First, aging is performed by applying an off-state voltage to the gate electrode 16 for 10 seconds in a state where a series voltage of 0 V is applied to the electrode A and a series voltage of –10 V is applied to the electrode B. Then, the direct voltages applied to the electrode A and the electrode B are switched, and in a state where the series voltage of –10 V is applied to the electrode A and the series voltage of 0 V is applied to the electrode B, aging is performed by applying an off-state voltage to the gate electrode 16 for ten seconds. The off-state voltages include three kinds, that is, +10 V, +15 V, and +20 V. FIG. 11 shows results of measuring off-leak current and on-state current of the TFT 10 to which aging has been performed for these three kinds.

As obvious from the results, it is found that off-leak current can be reduced by applying at least direct current voltages of 0 V to the source electrode 27, –10 V to the drain electrode 28, and +15 V or higher to the gate electrode 16 for ten seconds, and then exchanging the voltages applied to the source electrode 27 and the drain electrode 28 and further applying an off-state voltage for ten seconds in the same manner.

Through this aging step, the off-leak current is improved with respect to the TFTs having high off-leak current. Further, through this aging step, off-leak current of the TFTs in which the setting of the S/D impurity concentration is too high for example, can also be improved. The voltage for aging is larger than a normal drive voltage of an active matrix substrate. This means, as the off-leak current is never gradually reduced by normal driving, it is necessary to intentionally apply a voltage for aging.

In this aging step, it is acceptable to apply a pulse voltage to the source electrode 27 and the drain electrode 28, instead of the method of replacing the direct current voltages applied to the source electrode 27 and the drain electrode 28. One example is to apply a cyclical pulse voltage in which a time period that the electrode A becomes 0 V and an electrode B becomes –10 V is one second, and a time period that the electrode A becomes –10 V and the electrode B becomes 0 V is one second. In a state where this pulse voltage is applied to the source electrode 27 and the drain electrode 28, an off-state voltage is applied to the gate electrode 16 for twenty seconds. By this method, it is possible to perform desired voltage application by one sequence.

The TFT which is an object of the off-leak current reduction method according to the exemplary embodiment may be one of the first to fourth exemplary embodiments, or another TFT.

(Seventh Exemplary Embodiment)

Figure 12:
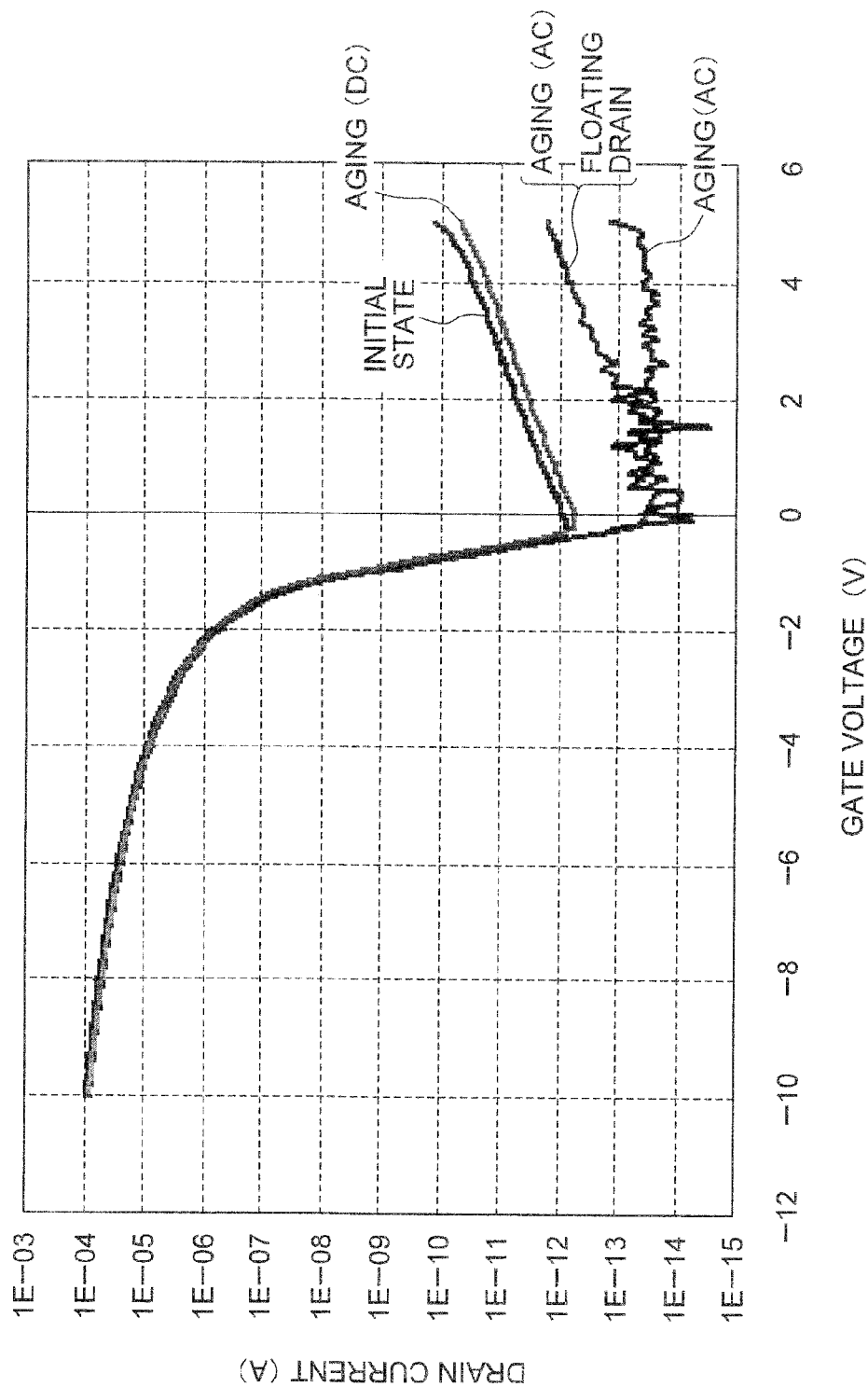
FIG. 12 is a graph showing effects of a method of reducing off-leak current of a TFT according to a seventh exemplary embodiment.

FIG. 12 is a graph showing the effects of an off-leak current reduction method of a TFT according to a seventh exemplary embodiment. Hereinafter, description will be given based on FIGS. 1 and 12.

Description will be given using a TFT 10 shown in FIG. 1. When either the source electrode 27 or the drain electrode 28 is in a floating state and a deep (large absolute value) off-state voltage is applied by pulse to the gate electrode 16, the off-leak current is reduced, as the aging effect in the sixth exemplary embodiment. Hereinafter, the off-leak current reduction method of the exemplary embodiment will be described in more detail.

In the off-leak current reduction method of the exemplary embodiment, an off-state voltage having a larger absolute value than that of a normal off-state voltage is applied to the gate electrode 16, before the normal off-state voltage is applied to the gate electrode 16 of the TFT 10. At this point, either the source electrode 27 or the drain electrode 28 is made into a floating state, and an off-state voltage having a larger absolute value than that of a normal off-state voltage is set as a pulse voltage.

In FIG. 12, the vertical axis shows drain current, and the horizontal axis shows a gate voltage. In other words, FIG. 12 shows gate voltage-drain current characteristics of a TFT. The TFT used in the exemplary embodiment is in "aging (AC) floating" shown in FIG. 12. Note that respective TFTs in "initial state" "aging (DC)" and "aging (AC)" are also shown in FIG. 12 for reference.

It is assumed that either the source electrode 27 or the drain electrode 28 is an electrode A, and the other one is an electrode B. When the electrode A is in a floating state, even if the electrode B which is not in a floating state is fixed at 0 V and a DC voltage of +20 V is applied to the gate electrode 16, off-leak current will not change. However, when the electrode B which is not in a floating state is fixed at 0 V and a pulse voltage composed of a low voltage 0 V and a high voltage +20 V is applied to the gate electrode 16 for ten seconds, off-leak current can be reduced regardless of the drain electrode 28 being the electrode A or the electrode B. Other configurations, operations and effects of the exemplary embodiment are the same as those of the sixth exemplary embodiment.

(Eighth Exemplary Embodiment)

Figure 13:
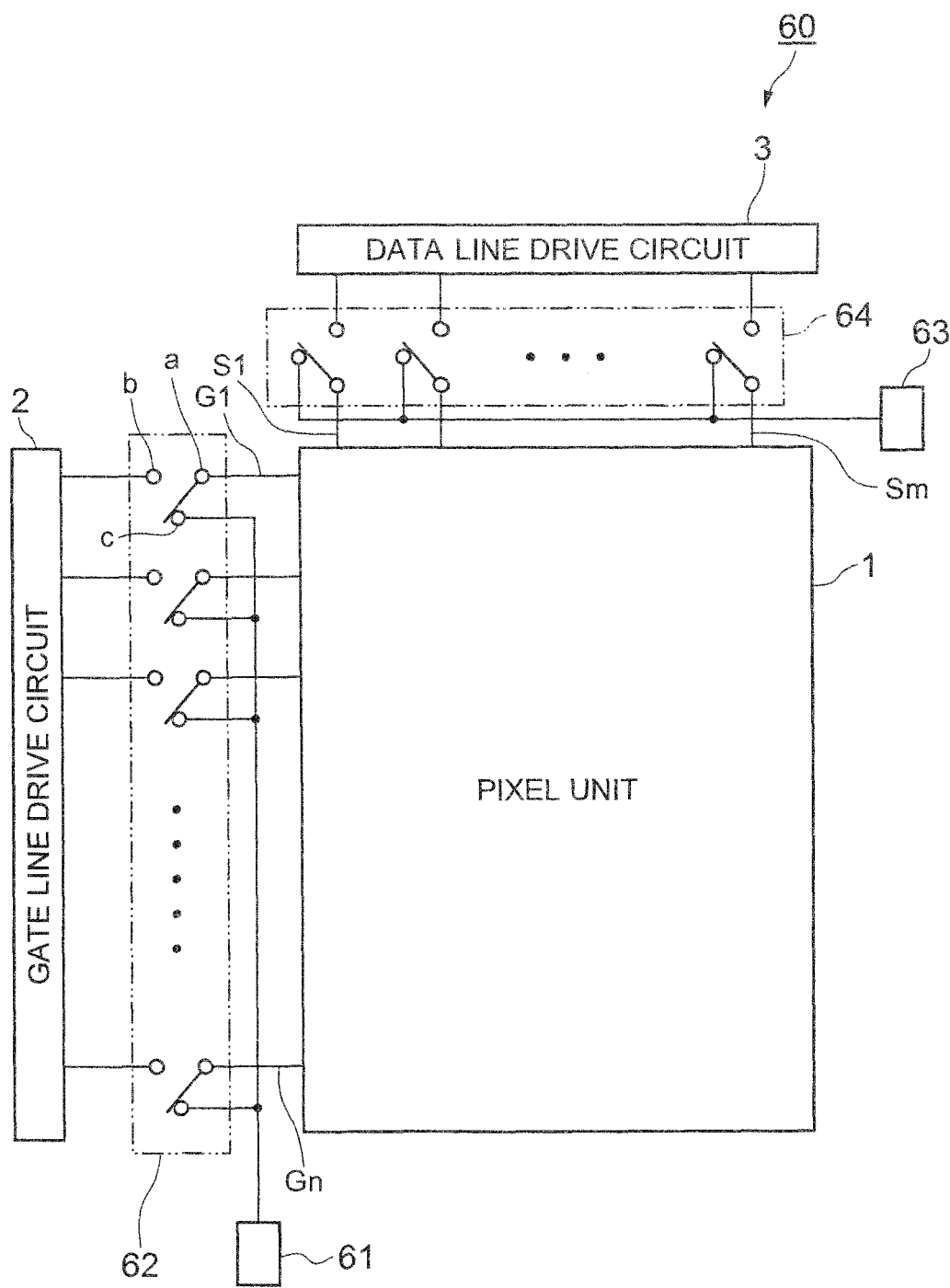
FIG. 13 is a block diagram showing a first example of an active matrix substrate according to an eighth exemplary embodiment.
Figure 14:
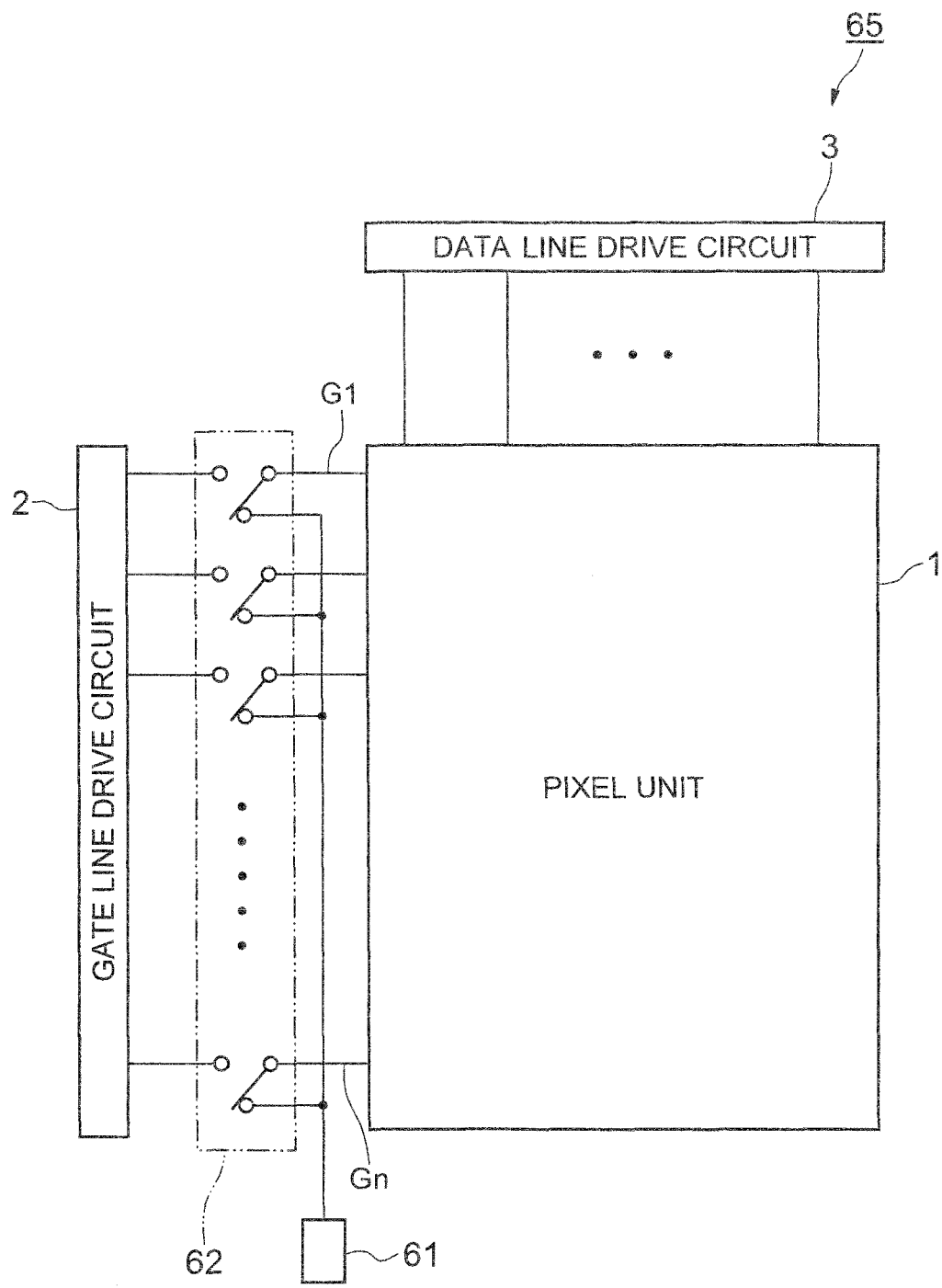
FIG. 14 is a block diagram showing a second example of an active matrix substrate according to the eighth exemplary embodiment.

FIGS. 13 and 14 are block diagrams showing active matrix substrates according to an eighth exemplary embodiment of the invention, in which FIG. 13 shows a first example, and FIG. 14 shows a second example. Hereinafter, description will be made based on FIGS. 13 and 14. However, the same components as those shown in FIG. 7 are denoted by the same reference numerals and their descriptions are not repeated herein.

In FIG. 13, an active matrix substrate 60 basically includes a voltage application terminal 61 to which a voltage having a higher absolute value than a normal drive voltage is applied, and a switch unit 62 which switches between the voltage applied to the voltage application terminal 61 and a voltage output from the gate line drive circuit 2 and supplies either voltage to the gate lines G1 to Gn. The active matrix substrate 60 further includes a voltage application terminal 63 to which a voltage having a higher absolute value than that of a normal drive voltage is applied, and a switch unit 64 which switches between the voltage applied to the voltage application terminal 62 and a voltage output from the data line drive circuit 3 and supplies either voltage to the data lines S1 to Sm.

The pixel unit 1, the gate line drive circuit 2, and the data line drive circuit 3 are the same as those of the fifth exemplary embodiment shown in FIGS. 7 to 10. The switch units 62 and 64 can be realized by the same TFT as those of the other circuits. One switch configuring the switch unit 62 may be composed of a first TFT for opening/closing between a contact "a" and a contact "b", and a second TFT for opening/closing between the contact "a" and a contact "c". When an on/off control voltage output from another circuit is applied to the gate electrodes of those TFTs, the interval between those contacts are opened or closed. The voltage application terminals 61 and 63 are made of conductors formed on the same substrate as that of other circuits, connected to one contact of each switch, and a predetermined voltage is applied from the outside of the active matrix substrate 60.

Although the aging method described in the sixth and seventh exemplary embodiments can basically be performed at any time after the source electrode, the drain electrode, and the gate electrode have been formed, it is more effective to be performed at the time of panel testing. As such, in the exemplary embodiment, aging at the time of panel testing is realized by switching signal input channels between the case where normal drive is performed and the case where aging voltage application is performed to the pixel unit 1, by using the voltage application terminals 61 and 63 and the switch units 62 and 64. The object of this aging is the pixel transistor 4 in FIG. 7.

As shown in the drawing, a specific voltage application sequence is that, with the switch units 62 and 64 being in a state of contacts to which an aging voltage is input, first a voltage for turning on a p-channel type TFT is applied to the voltage application terminal 61, and a positive voltage A is applied to the voltage application terminal 63. Next, a positive voltage larger than the normal drive voltage is applied to the voltage application terminal 61 so as to turn off the p-channel type TFT, and then a negative voltage B is applied to the voltage application terminal 63. In this state, a voltage of |A-B| is applied between the source and the drain of the p-channel type TFT, and the voltage applied to the voltage application terminal 61 is applied to the gate, whereby an aging effect can be achieved.

The active matrix substrate 65 in FIG. 14 basically includes the voltage application terminal 61 to which a voltage having a higher absolute value than that of a normal drive voltage is applied, and the switch unit 62 which switches between the voltage applied to the voltage application terminal 61 and a voltage output from the gate line drive circuit 2 and supplies either voltage to the gate lines G1 to Gn. However, the voltage application terminal 63 and the switch unit 64 in FIG. 13 are omitted.

In the active matrix substrate 65, in a display state where the largest voltage that can be achieved by the data line drive circuit 3 in normal drive is to be output, as a potential difference is caused between the source and the drain of the p-channel type TFT, an aging effect can also be achieved by applying a positive voltage larger than that of a normal drive voltage to the voltage application terminal 61. Other configurations, operations, and effects of the active matrix substrate 65 are the same as those of the active matrix substrate 60 in FIG. 13.

(Ninth Exemplary Embodiment)

Figure 15:
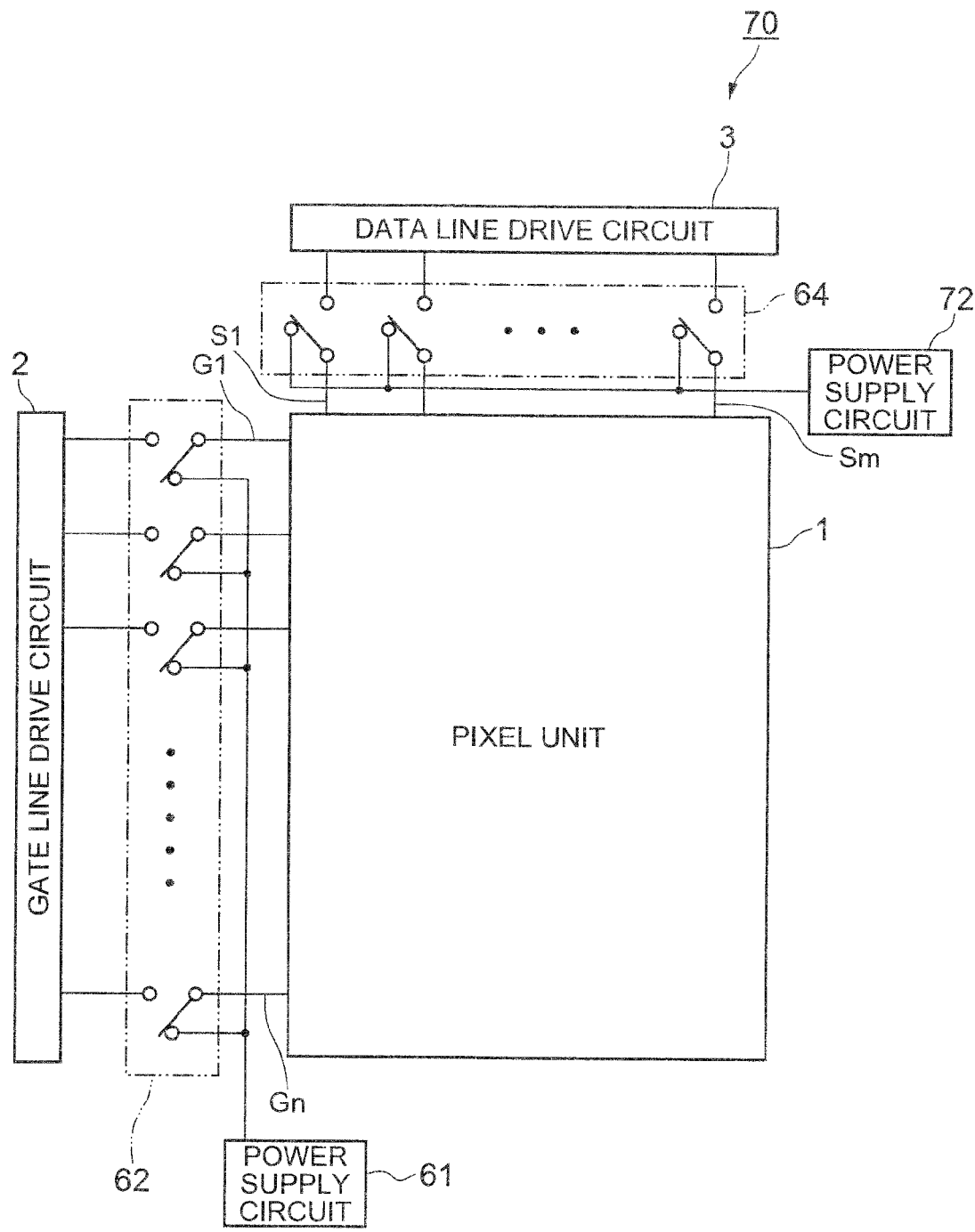
FIG. 15 is a block diagram showing a first example of an active matrix substrate according to a ninth exemplary embodiment.
Figure 16:
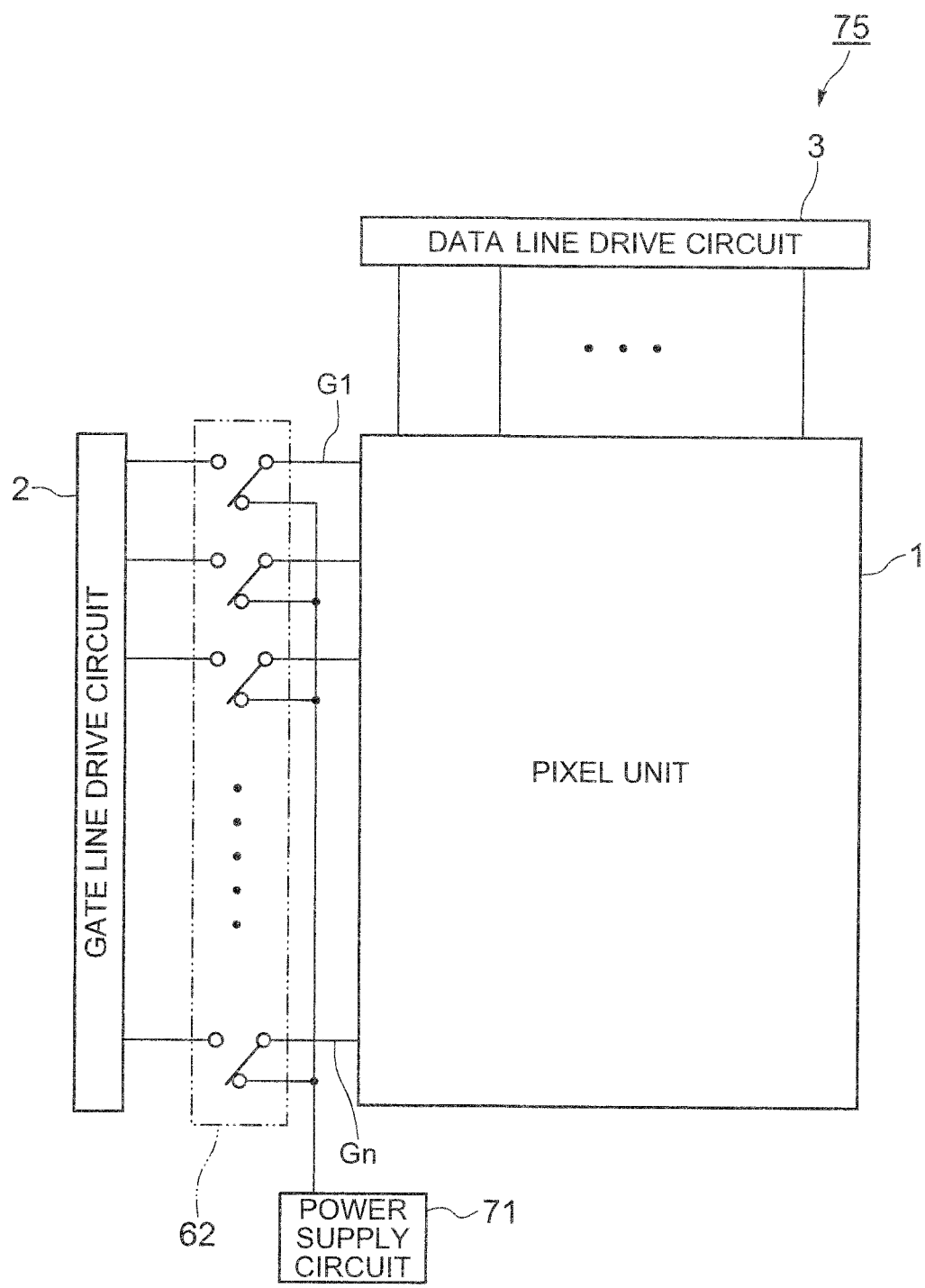
FIG. 16 is a block diagram showing a second example of an active matrix substrate according to the ninth exemplary embodiment.

FIGS. 15 and 16 are block diagrams showing active matrix substrates according to a ninth exemplary embodiment of the invention, in which FIG. 15 shows a first example, and FIG. 16 shows a second example. Hereinafter, description will be given based on FIGS. 15 and 16. However, the same components as those shown in FIGS. 7 and 13 are denoted by the same reference numerals and their descriptions are not repeated herein.

An active matrix substrate 70 in FIG. 15 basically includes a power supply circuit 71 which outputs a voltage having a higher absolute value than that of a normal drive voltage, and a switch unit 62 which switches between a voltage output from the power supply circuit 71 and a voltage output from the gate line drive circuit 2 and supplies either voltage to gate lines G1 to Gn. Further, the active matrix substrate 70 includes a power supply circuit 72 which outputs a voltage having a higher absolute value than that of a normal drive voltage, and a switch unit 64 which switches a voltage output from the power supply circuit 72 and a voltage output from the data line drive circuit 3 and supplies either voltage to data lines S1 to Sm. As the power supply circuits 71 and 72 are typical DC power supply circuits, detailed description thereof is omitted.

In the aging method described above, as it returns to the original (off-leak current increases) when the environmental temperature becomes high, it is preferable that a power supply circuit for aging is provided to an active matrix substrate so that aging can be performed at any time when necessary. As such, the active matrix substrate 70 of the exemplary embodiment includes the power supply circuits 71 and 72 and the switch units 62 and 64 so that the switch units 62 and 64 switch between signals of a normal voltage and signals of the power supply circuits 71 and 72 and supplies the voltages to the pixel unit 1. Thereby, aging can be performed at any time, not only the time of panel testing. Even in the case where the temperature increases so that the aging effect has been dissolved, aging can be performed again. A specific aging method is the same as that described in the eighth exemplary embodiment. Other configurations, operations, and effects of the active matrix substrate 70 are the same as those of the active matrix substrate 60 shown in FIG. 13.

An active matrix substrate 75 in FIG. 16 basically includes the power supply circuit 71 which outputs a voltage having a higher absolute value than that of a normal drive voltage, and the switch 62 which switches a voltage output from the power supply circuit 71 and a voltage output from the gate line drive circuit 2 and supplies either voltage to the gate lines G1 to Gn. However, the power supply circuit 72 and the switch unit 64 shown in FIG. 15 are not included.

In the active matrix substrate 75, it is acceptable to set a display state for outputting a largest voltage which can be realized by the data line drive circuit 3 in a normal drive and to apply a positive voltage larger than a normal drive voltage by the power supply circuit 71, which is the same as the case of the active matrix substrate 65 in FIG. 14. Other configurations, operations, and effects of the active matrix substrate 75 are the same as those of the active matrix substrate 70 in FIG. 15.

(Tenth Exemplary Embodiment)

Figure 17:
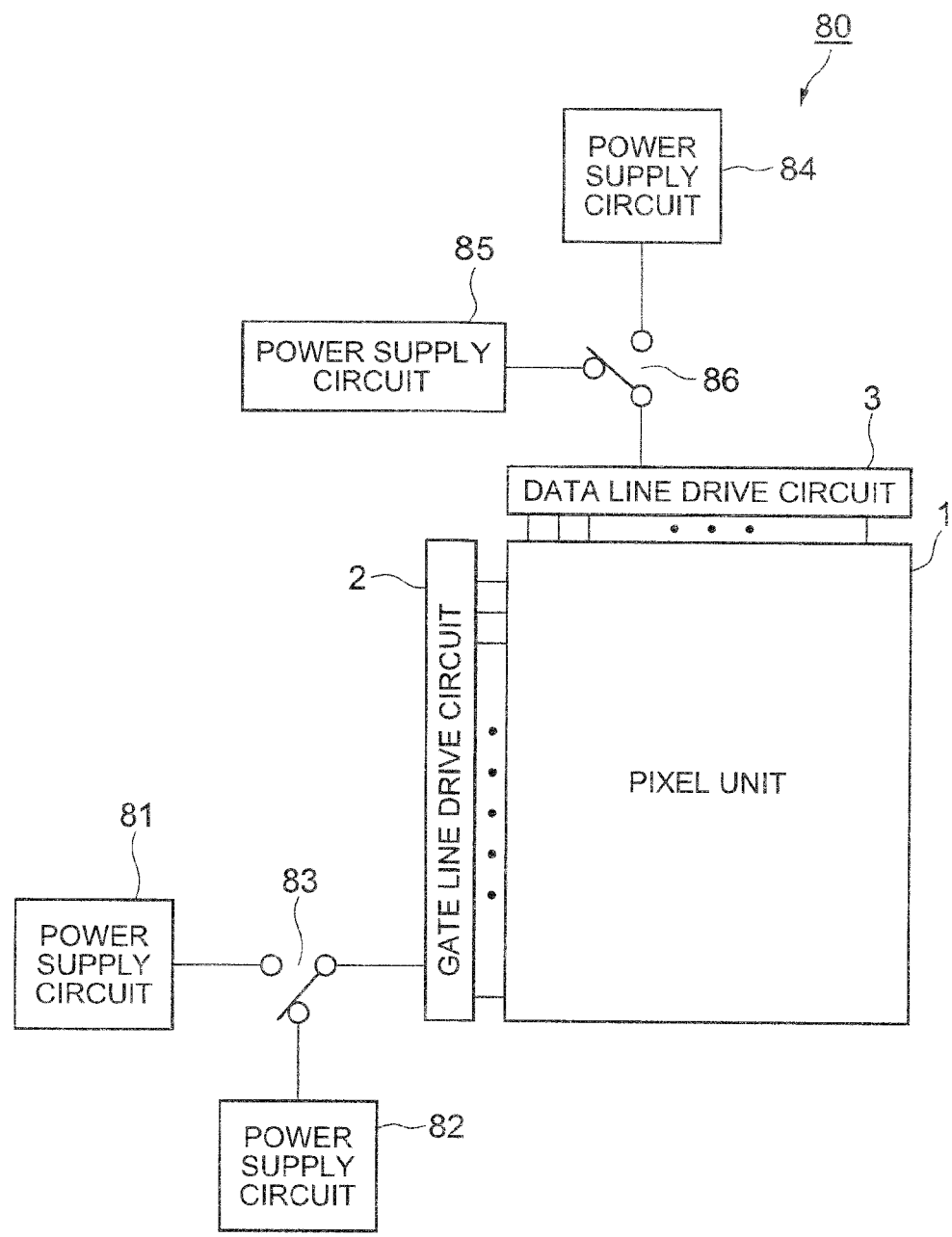
FIG. 17 is a block diagram showing an active matrix substrate according to a tenth exemplary embodiment.

FIG. 17 is a block diagram showing an active matrix substrate according to a tenth exemplary embodiment of the invention. Hereinafter, description will be given based on FIG. 17. However, the same components as those in FIG. 7 are denoted by the same reference numerals and their descriptions are not repeated herein.

An active matrix substrate 80 of the exemplary embodiment basically includes a power supply circuit 81 which outputs a normal drive voltage, a power supply circuit 82 which outputs a voltage having a higher absolute value than that of a normal drive voltage, and a switch unit 83 which switches between a voltage output from the power supply circuit 81 and a voltage output from the power supply circuit 82 and supplies either voltage to the gate line drive circuit 2. The active matrix substrate 80 further includes a power supply circuit 84 which outputs a normal drive voltage, a power supply circuit 85 which outputs a voltage having a higher absolute value than that of a normal drive voltage, and a switch unit 86 which switches between a voltage output from the power supply circuit 84 and a voltage output from the power supply circuit 85 and supplies either voltage to the data line drive circuit 3.

In the exemplary embodiment, aging is performed in an easier and more effective manner not only on a pixel transistor but also on a TFT configuring each drive circuit. As such, the exemplary embodiment is configured such that in addition to the power supply circuit 81 which supplies a voltage to the gate line drive circuit 2 at the time of normal drive, another power supply circuit 82 which supplies a larger voltage to the gate line drive circuit 2 is also provided, and the voltage output from the power supply circuit 81 and the voltage output from the power supply circuit 82 are switched by the switch unit 83 so as to be supplied to the gate line drive circuit 2. With this configuration, aging can be performed at any time.

Respective output voltages of the power supply circuits 81 and 82 are used as VSS and VDD described in FIG. 9 for example, and preferably, used as CL1, CL2, and start pulse signals ST, in addition to VSS and VDD. The switch unit 83 can be realized by the same TFT as that in another circuit. For example, in the case of using respective output voltages of the power supply circuits 81 and 82 are used as VSS, the switch unit 83 includes a TFT connecting the output terminal of the power supply circuit 81 and the terminal of VSS and a TFT connecting the output terminal of the power supply circuit 82 and the terminal of VSS. A specific aging method is the same as that described in the eighth exemplary embodiment. Further, by using the output signal OUT1 shown in FIG. 9, aging of a pixel transistor can also be carried out.

Note that the power supply circuits 81 and 82 may be replaced with a single power supply circuit having the both functions so as to switch between voltages according to a control signal and output. As the power supply circuits 81 and 82 are typical DC power supply circuits, the detailed description thereof is omitted.

Similarly, the exemplary embodiment is configured such that in addition to the power supply circuit 84 which supplies a voltage to the data line drive circuit 3 in a normal driving state, another power supply circuit 85 for supplying a larger voltage to the data line drive circuit 3 is provided, and the voltage output from the power supply circuit 84 and the voltage output from the power supply circuit 85 are switched by the switch unit 80 so as to be supplied to the data line drive circuit 3, whereby aging can be carried out at any time. However, the power supply circuits 84 and 85 and the switch unit 86 are not always necessary, as described in the eighth and ninth exemplary embodiments.

(Others)

As described above, in the configuration of using a p-channel type TFT as a pixel transistor and using only p-channel type TFTs for all drive circuits for driving the scan lines, the problems described above can be solved by setting the S/D impurity concentration of all TFTs to be $2*10^{-19}$ cm$^{-3}$ or less, and preferably, using a multi-gate structure in which a plurality of gates are aligned in series with respect to all TFTs, and more preferably, including a drive circuit for carrying out aging. Further, in the case where off-leak current cannot be sufficiently reduced in some TFTs due to the problem of manufacturing tolerance, off-leak current can be reduced by carrying out the aging, whereby the problem can be solved stably.

Although the present invention has been described with reference to the above exemplary embodiments, the present invention is not limited to these exemplary embodiments. Various changes in form and details that can be understood by those skilled in the art may be made therein. Further, the present invention includes parts or whole of the configurations of the above exemplary embodiment which are combined together appropriately.

According to the present invention, off-leak current can be sufficiently reduced with a TFT of a single gate structure, and off-leak current of a TFT required for a drive circuit made of a TFT of a single conductivity type can be realized by simple manufacturing steps.

What is claimed is:

1. A drive circuit comprising a thin film transistor of a single conductivity type, wherein
   impurity concentration of a source region and a drain region of the thin-film transistor is between $2*10^{18}$ cm$^{-3}$ and $2*10^{19}$ cm$^{-3}$,
   the thin film transistor includes a silicon film, a gate insulating film, and a gate electrode, laminated in this order, and
   at least a part of the gate electrode and at least a part of the source region and the drain region formed in the silicon film are overlapped via the gate insulating film.

2. The drive circuit according to claim 1, wherein the thin film transistor is of a p-channel type.

3. The drive circuit according to claim 1, wherein the thin film transistor is a double-gate type, a triple-gate type, or a quadruple-gate type.

4. The drive circuit according to claim 1, wherein the drive circuit is a gate line drive circuit including a bootstrap scan circuit.

5. An active matrix substrate comprising:
a plurality of gate lines;
a plurality of data lines;
a pixel transistor formed at each of nodes between the plurality of gate lines and the plurality of data lines; and
a gate line drive circuit which sequentially applies a drive voltage to the plurality of gate lines, wherein
the gate line drive circuit is the drive circuit according to claim 1.

6. The active matrix substrate according to claim 5, wherein
each of the pixel transistor and the thin film transistor configuring the gate line drive circuit is a p-channel type thin film transistor, and
impurity concentration of a source region and a drain region of the p-channel type thin film transistor is between $2*10^{18}$ cm$^{-3}$ and $2*10^{19}$ cm$^{-3}$.

7. The active matrix substrate according to claim 5, further comprising:
a voltage application terminal to which a voltage is applied; and
a switch unit which switches between the voltage applied to the voltage application terminal and a voltage output from the gate line drive circuit, and supplies either voltage to the gate line.

8. The active matrix substrate according to claim 5, further comprising:
a power supply circuit which outputs a voltage having a higher absolute value than that of the drive voltage; and
a switch unit which switches between the voltage output from the power supply circuit and a voltage output from the gate line drive circuit, and supplies either voltage to the gate line.

9. The active matrix substrate according to claim 5, further comprising:
a first power supply circuit which outputs the drive voltage;
a second power supply circuit which outputs a voltage having a higher absolute value than that of the drive voltage; and
a switch unit which switches between the voltage output from the first power supply circuit and the voltage output from the second power supply circuit, and supplies either voltage to the gate line.

10. A liquid crystal display device, comprising:
the active matrix substrate according to claim 5;
a counter substrate opposite the active matrix substrate; and
liquid crystal interposed between the counter substrate and the active matrix substrate.

11. A drive circuit comprising a thin film transistor of a single conductivity type, wherein
impurity concentration of a source region and a drain region of the thin film transistor is between $2*10^{18}$ cm$^{-3}$ and $2*10^{19}$ cm$^{-3}$,
the thin film transistor includes an auxiliary gate electrode, an auxiliary gate insulating film, a silicon, film, a gate insulating film, and a gate electrode laminated in this order, the auxiliary gate electrode and the gate electrode being electrically short-circuited, and
at least a part of the auxiliary gate electrode and at least a part of the source region and the drain region formed in the silicon film are overlapped via the auxiliary gate insulating film.

12. A method of reducing off-leak current of a thin film transistor in which impurity concentration of a source region and a drain region is between $2*10^{18}$ cm$^{-3}$ and $2*10^{19}$ cm$^{-3}$, comprising:
applying to a gate electrode of the thin film transistor an off-state voltage having a larger absolute value than that of a normal off-state voltage, while also applying a constant voltage or a pulse voltage, in which a polarity is reversed, between a source electrode and a drain electrode of the thin film transistor, then
applying the normal off-state voltage to the gate electrode of the thin film transistor.

13. A method of reducing off-leak current of a thin film transistor in which impurity concentration of a source region and a drain region is between $2*10^{18}$ cm$^{-3}$ and $2*10^{19}$ cm$^{-3}$, comprising:
applying to a gate electrode of the thin film transistor an off-state pulse voltage having a larger absolute value than that of a normal off-state voltage, while also allowing either a source electrode or a drain electrode of the thin film transistor to be in a floating state, then
applying the normal off-state voltage to the gate electrode of the thin film transistor.

* * * * *